US010733936B2

(12) United States Patent
Lee et al.

(10) Patent No.: US 10,733,936 B2
(45) Date of Patent: Aug. 4, 2020

(54) ORGANIC LIGHT-EMITTING DISPLAY DEVICE AND METHOD OF DRIVING THE SAME

(71) Applicant: LG Display Co., Ltd., Seoul (KR)

(72) Inventors: Joonhee Lee, Seoul (KR); Janghwan Kim, Paju-si (KR); Dongwon Park, Goyang-si (KR); Jongmin Park, Anyang-si (KR); Yongchul Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 167 days.

(21) Appl. No.: 15/841,766

(22) Filed: Dec. 14, 2017

(65) Prior Publication Data

US 2018/0182297 A1 Jun. 28, 2018

(30) Foreign Application Priority Data

Dec. 26, 2016 (KR) ........................ 10-2016-0179452

(51) Int. Cl.
*G09G 3/3258* (2016.01)
*G09G 3/3225* (2016.01)
(Continued)

(52) U.S. Cl.
CPC ......... *G09G 3/3258* (2013.01); *G09G 3/2077* (2013.01); *G09G 3/3225* (2013.01);
(Continued)

(58) Field of Classification Search
CPC ......... G09G 3/3258; G09G 2310/0264; G09G 2320/043; G09G 2320/0673;
(Continued)

(56) References Cited

U.S. PATENT DOCUMENTS

2011/0273441 A1 11/2011 Shin et al.
2014/0340379 A1 11/2014 Kim et al.
(Continued)

FOREIGN PATENT DOCUMENTS

CN 102243840 A 11/2011
CN 104517568 A 4/2015
(Continued)

OTHER PUBLICATIONS

Extended European Search Report dated Mar. 23, 2018 from the European Patent Office in counterpart EP application No. 17206937.9.

(Continued)

*Primary Examiner* — Abhishek Sarma
(74) *Attorney, Agent, or Firm* — Morgan, Lewis & Bockius LLP

(57) ABSTRACT

An organic light-emitting display device and a method of driving the same are disclosed. The organic light-emitting display device includes a display panel including sub-pixels, a power supply configured to output a voltage for driving the sub-pixels, a selective driver configured to generate a control signal to selectively drive a drive transistor of the sub-pixels between first and second driving schemes, wherein the drive transistor is driven in a saturation region in the first driving scheme, and is driven in a linear region in the second driving scheme, and a gamma change driver configured to change a gamma based on the driving scheme selected by the selective driver.

14 Claims, 24 Drawing Sheets

(51) Int. Cl.
*G09G 3/20* (2006.01)
*G09G 3/3275* (2016.01)
*H01L 27/32* (2006.01)

(52) U.S. Cl.
CPC ........... *G09G 3/3275* (2013.01); *H01L 27/32* (2013.01); *G09G 2310/0264* (2013.01); *G09G 2320/043* (2013.01); *G09G 2320/0673* (2013.01); *G09G 2330/021* (2013.01); *G09G 2360/16* (2013.01)

(58) Field of Classification Search
CPC ......... G09G 2330/021; G09G 2360/16; G09G 3/2077; G09G 3/3225; G09G 3/3275; H01L 27/32
See application file for complete search history.

(56) References Cited

U.S. PATENT DOCUMENTS

| | | | | |
|---|---|---|---|---|
| 2015/0097872 | A1 | 4/2015 | Jeong et al. | |
| 2016/0293101 | A1 | 10/2016 | Jeong et al. | |
| 2017/0193900 | A1* | 7/2017 | Kwon | G09G 3/3233 |

FOREIGN PATENT DOCUMENTS

| | | | |
|---|---|---|---|
| CN | 106935189 | A | 7/2017 |
| KR | 2012-0110257 | A | 10/2012 |

OTHER PUBLICATIONS

Notification of First Office Action dated Apr. 1, 2020, issued in corresponding Chinese Patent Application No. 201711363174.4.

* cited by examiner

ORGANIC LIGHT-EMITTING DISPLAY DEVICE AND METHOD OF DRIVING THE SAME

This application claims the benefit of Korean Patent Application No. 10-2016-0179452, filed on Dec. 26, 2016, which is incorporated herein by reference for all purposes as if fully set forth herein.

BACKGROUND

Technical Field

The present disclosure relates to an organic light-emitting display device and a method of driving the same.

Discussion of the Related Art

Along with evolving information technology, display devices have been widely used as a connection medium between a user and information. In this regard, as one type of display device, an organic light-emitting display device has been increasingly employed.

The organic light-emitting display device may include a display panel including a plurality of sub-pixels, a driver to output a drive signal to drive the display panel, and a power supply to generate power to be supplied to the driver and display panel. The driver may include a scan driver to supply a scan signal or a gate signal to the display panel, and a data driver to supply a data signal to the display panel.

When the sub-pixels in the display panel receive drive signals—for example, the scan signal and the data signal—a selected sub-pixel emits a light beam. In this manner, the sub-pixels may display an image.

The organic light-emitting display device may be implemented in a variety of devices, such as a television, a navigation device, a video player, a personal computer, wearable devices including, for example, a watch and glasses, and mobile phones including, for example, a smartphone. There is a need to reduce power consumption in organic light-emitting display devices of the related art.

SUMMARY

Accordingly, the present disclosure is directed to an organic light-emitting display device and a method of driving the same that substantially obviate one or more of the problems due to limitations and disadvantages of the related art.

An object of the present disclosure is to provide an organic light-emitting display device with reduced power consumption.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, an organic light-emitting display device includes a display panel including sub-pixels, a power supply configured to output a voltage for driving the sub-pixels, a selective driver configured to generate a control signal to selectively drive a drive transistor of the sub-pixels between first and second driving schemes, wherein the drive transistor is driven in a saturation region in the first driving scheme, and is driven in a linear region in the second driving scheme, and a gamma change driver configured to change a gamma based on the driving scheme selected by the selective driver.

In another aspect, a method of driving an organic light-emitting display device includes generating a control signal to selectively drive a drive transistor of sub-pixels between first and second driving schemes, wherein the drive transistor is driven in a saturation region in the first driving scheme, and is driven in a linear region in the second driving scheme, generating a signal to change a gamma based on the selected driving scheme, and changing a level of a voltage to be supplied to the sub-pixels based on the selected driving scheme.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to embodiments of the present disclosure, examples of which are illustrated in the accompanying drawings.

An organic light-emitting display device may be implemented, for example, as a top-emission, bottom-emission, or dual-emission type, depending on a light-emission direction therefrom.

The organic light-emitting display device may also be implemented, for example, as an inverted staggered, staggered, or coplanar type, depending on a channel structure of a transistor employed. The inverted staggered type may include a back channel etched (BCE) type or an etch stopper (ES) type.

The organic light-emitting display device may further be implemented, for example, as an oxide, low temperature poly-silicon (LTPS), amorphous silicon (a-Si), or poly-silicon (p-Si) type, depending on a semiconductor material of a transistor.

The organic light-emitting display device may be implemented, for example, in a television, a navigation device, a video player, a personal computer, wearable devices, such as watches and glasses, and mobile phones, such as a smartphone.

A First Example Embodiment

Figure 1:
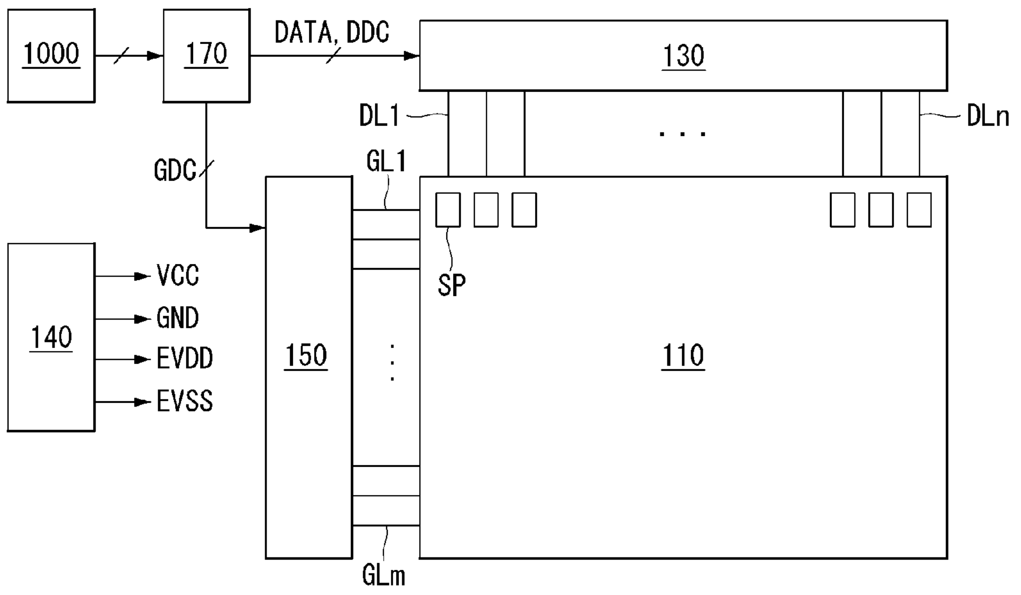
FIG. 1 is a schematic block view of an organic light-emitting display device in accordance with a first example embodiment of the present disclosure.
Figure 2:
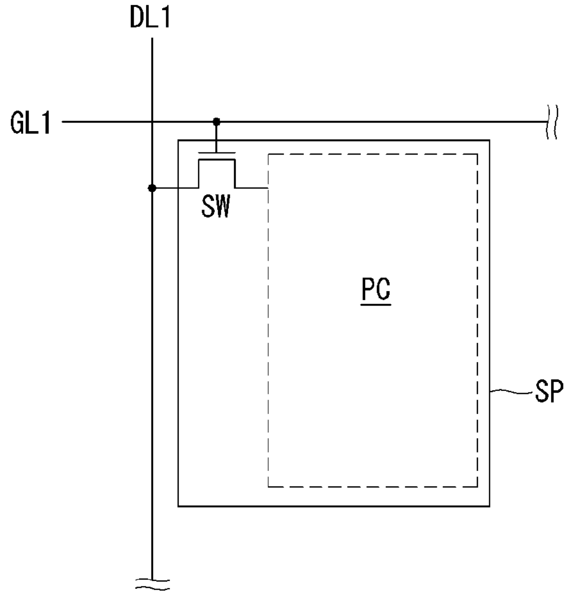
FIG. 2 schematically illustrates a configuration of a sub-pixel in FIG. 1.

FIG. 1 is a schematic block view of an organic light-emitting display device in accordance with a first example embodiment of the present disclosure. FIG. 2 schematically illustrates a configuration of a sub-pixel in FIG. 1.

As shown in FIG. 1, the organic light-emitting display device may include a host system 1000, a timing controller 170, a data driver 130, a power supply 140, a gate driver 150, and a display panel 110.

The host system 1000 may include a SoC (System on Chip) having a scaler disposed therein. The host system 1000 may convert digital video data of an input video to a data signal with a suitable format for display on the display panel 110 and then output the data signal. The host system 1000 may also supply a variety of timing signals along with the data signal to the timing controller 170.

The timing controller 170 may be configured to control operation timings of the data driver 130 and the gate driver 150 based on the timing signals from the host system 1000. Examples of the timing signals include vertical and horizontal synchronization signals, a data enable signal, and a main clock signal. The timing controller 170 may be configured to a perform video process, such as data compensation, for the data signal from the host system 1000, and then supply the processed or compensated data signal DATA to the data driver 130.

The data driver 130 may be configured to operate based on a data control signal DDC, etc. from the timing controller 170. The data driver 130 may be configured to convert the data signal DATA in a digital form from the timing controller 170 to a data signal in an analog form and then output the analog data signal.

In this regard, the data driver 130 may be configured to convert the data signal DATA in a digital form to the data signal in an analog form based on gamma voltages from a gamma circuit inside or outside the data driver 130. The data driver 130 may be configured to supply the analog data signal to data lines DL1 to DLn of the display panel 110, where n is a positive integer greater than 1.

The gate driver 150 may be configured to operate based on a gate control signal GDC from the timing controller 170. The gate driver 150 may be configured to output a gate signal or a scan signal of a gate high voltage or a gate low voltage.

The gate driver 150 may be configured to sequentially output the gate signal in a forward or reverse direction. The gate driver 150 may be configured to supply the gate signal to gate lines GL1 to GLm of the display panel 110, where m is a positive integer greater than 1.

The power supply 140 may be configured to output a high level voltage (e.g., a drain voltage) EVDD and a low level voltage (e.g., a source voltage) EVSS for driving the display panel 110, and a collector voltage VCC and a ground voltage GND for driving the data driver 130, etc. Additionally, the power supply 140 may be configured to generate voltages used in operating the display device, such as the gate high voltage or the gate low voltage to be supplied to the gate driver 150.

The display panel 110 may include sub-pixels SP, the data lines DL1 to DLn coupled to the sub-pixels SP respectively, and the gate lines GL1 to GLm coupled to the sub-pixels SP respectively. The display panel 110 may be configured to display an image based on the gate signal from the gate driver 150 and the data signal from the data driver 130. The display panel 110 may include lower and upper substrates. The sub-pixels SP may be disposed between the lower and upper substrates.

As shown in FIG. 2, for example, a single sub-pixel SP may include a switching thin film transistor SW coupled to the gate line GL1 and the data line DL1 (or disposed at an intersection thereof), and a pixel circuit PC configured to operate based on the data signal supplied via the switching thin film transistor SW. The pixel circuit PC may include a drive transistor, a storage capacitor, an organic light-emitting diode, and a pixel compensation circuit (not shown). The pixel compensation circuit may be configured to compensate for at least one of the drive transistor, storage capacitor, and organic light-emitting diode.

The pixel compensation circuit may be configured to compensate for characteristics of the drive transistor (for example, a threshold voltage or current mobility, etc.) and/or characteristics of the organic light-emitting diode (for example, a threshold voltage), and/or for deteriorations thereof. The pixel compensation circuit may operate independently or in association with an external circuit. The pixel compensation circuit may include at least one thin film transistor and capacitor. The pixel compensation circuit can be configured in a wide variety of ways depending on a compensation method. Thus, a specific illustration and description thereof will be omitted.

Figure 3:
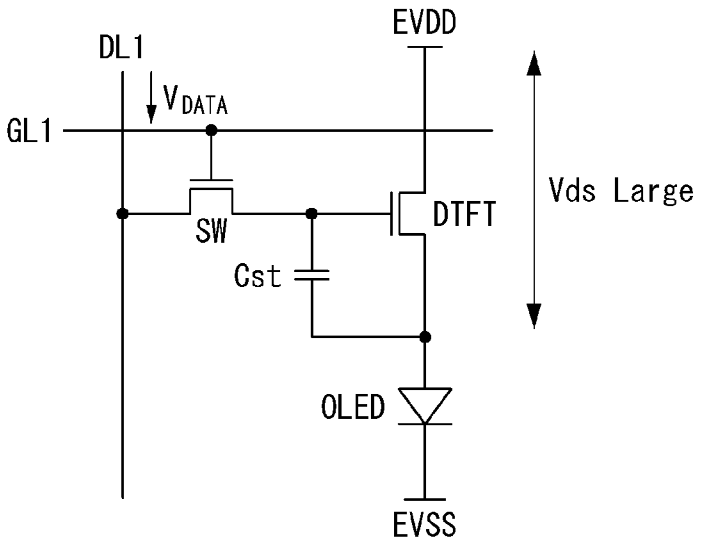
FIG. 3 illustrates a circuit configuration of a related art sub-pixel.
Figure 4:
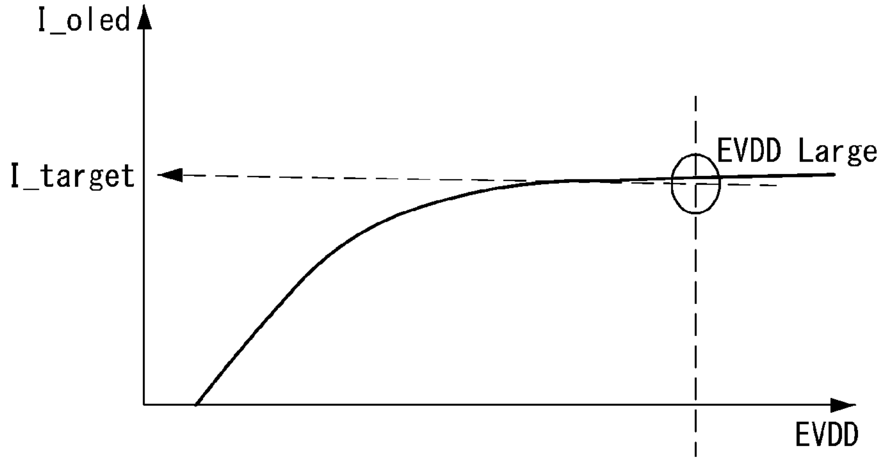
FIG. 4 is a graph of a current versus voltage curve of a drive transistor based on a related art driving scheme.

FIG. 3 illustrates a circuit configuration of a related art sub-pixel. FIG. 4 is a graph of a current versus voltage curve of a drive transistor based on a related art driving scheme.

As shown in FIG. 3 and FIG. 4, in the related art driving scheme, a drive transistor DTFT is driven in a saturation region of the current versus voltage curve to operate the sub-pixel. Thus, a high level drive voltage (that is, a high level Vds and EVDD as shown in FIGS. 3 and 4) was used.

In this way, because the related art organic light-emitting display device drives the drive transistor DTFT in the saturation region of the current versus voltage curve, the high level voltage EVDD is used, leading to unnecessarily high power consumption.

Figure 5:
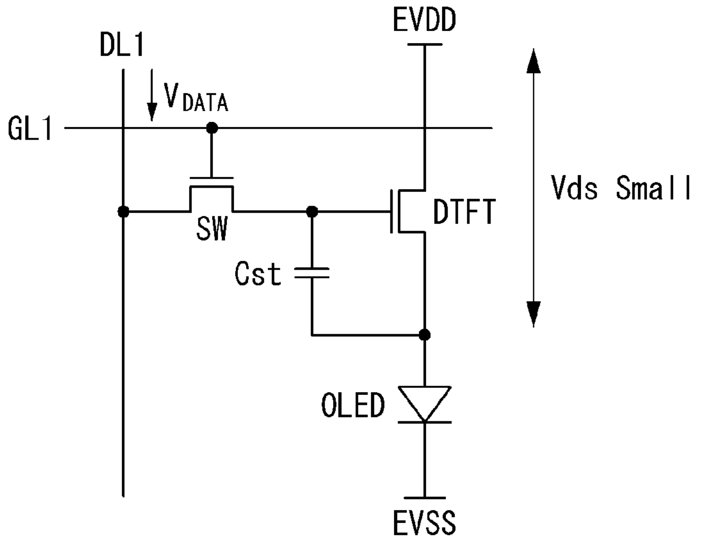
FIG. 5 illustrates a circuit configuration of a sub-pixel in accordance with a first example embodiment of the present disclosure.
Figure 6:
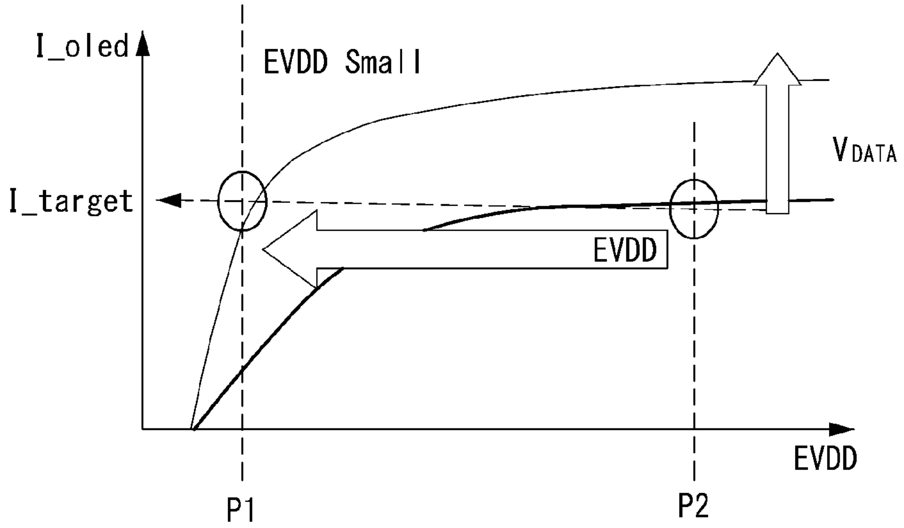
FIG. 6 is a graph of current versus voltage curves of a drive transistor in accordance with a first example embodiment of the present disclosure.
Figure 7:
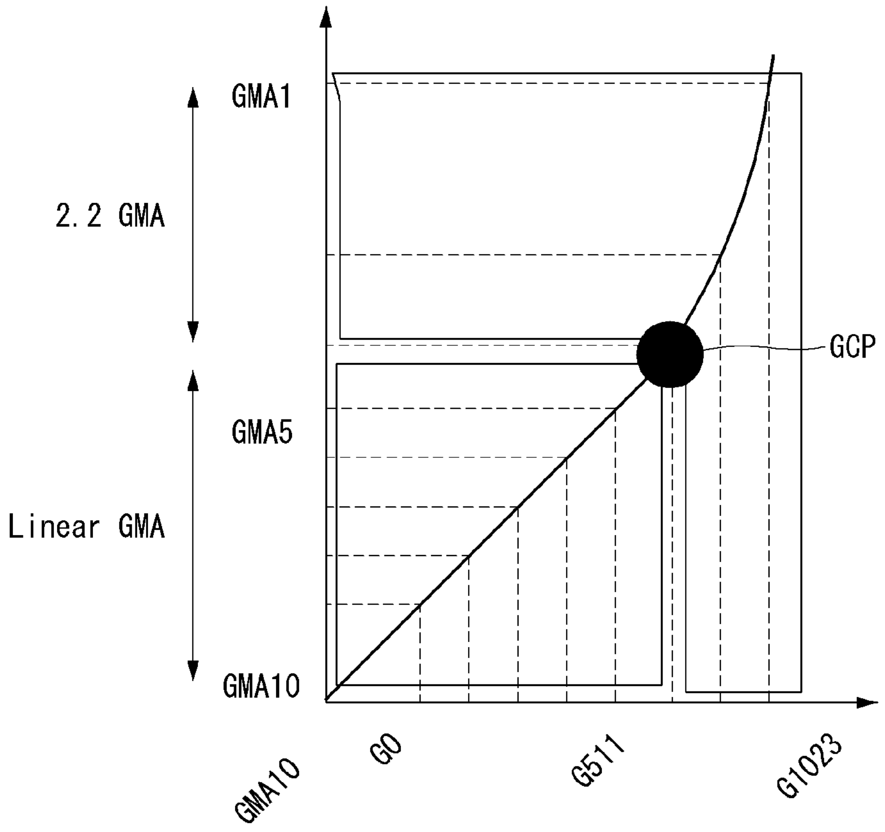
FIG. 7 is a graph of a gamma voltage versus gray-scale curve for describing a gray-scale expression scheme in accordance with a first example embodiment of the present disclosure.
Figure 8:
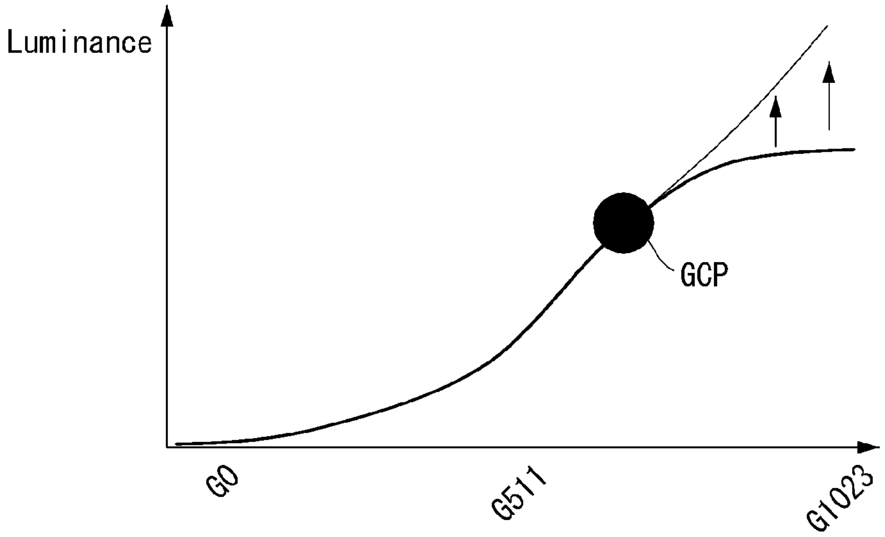
FIG. 8 is a graph of a luminance versus gray-scale curve based on a gray-scale expression scheme in FIG. 7.
Figure 9:
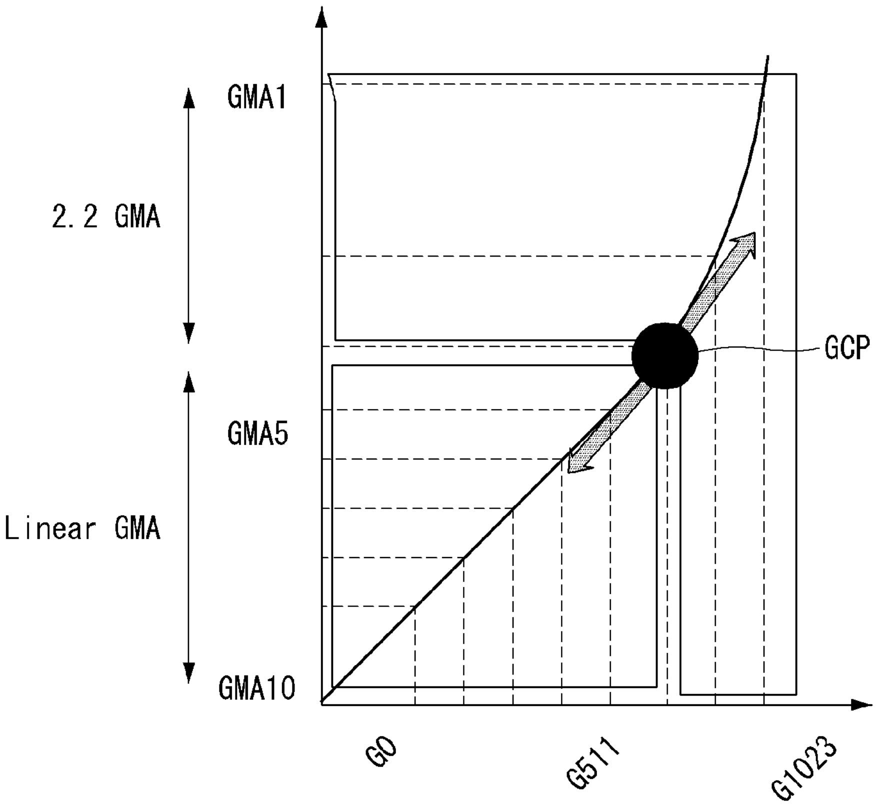
FIG. 9 is a graph of an adaptive gamma curve for gray-scale expression in accordance with a first example embodiment of the present disclosure.
Figure 10:
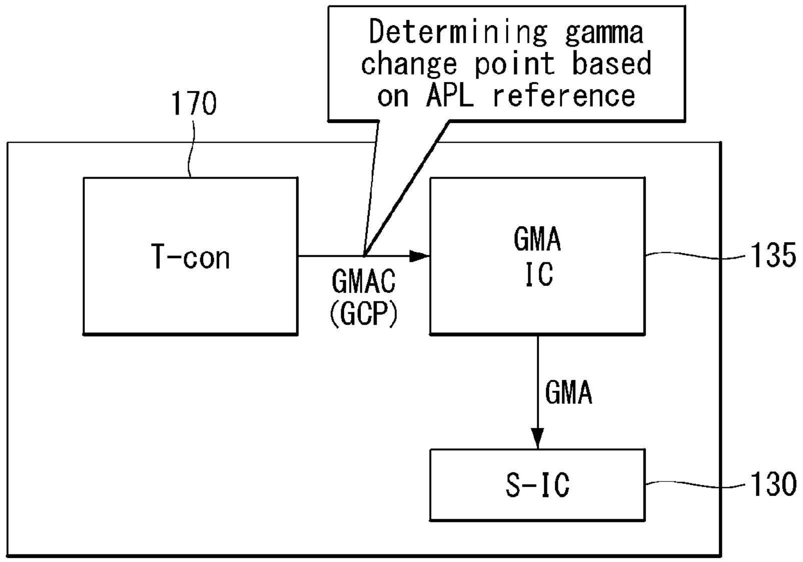
FIG. 10 illustrates an example configuration of a device in accordance with a first example embodiment of the present disclosure.
Figure 11:
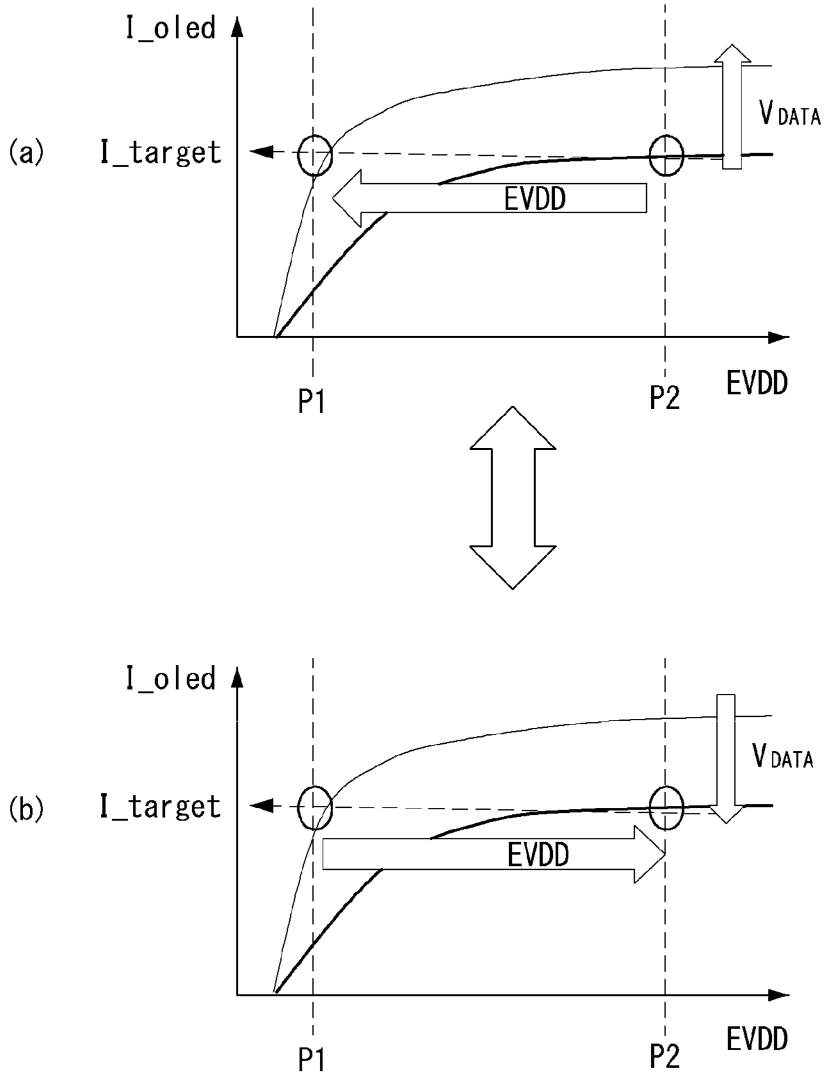
FIG. 11 is a graph of current versus voltage curves of a drive transistor for describing a driving method of an organic light-emitting display device in accordance with a first example embodiment of the present disclosure.

FIG. 5 illustrates a circuit configuration of a sub-pixel in accordance with a first example embodiment of the present disclosure. FIG. 6 is a graph of current versus voltage curves of a drive transistor in accordance with a first example embodiment of the present disclosure. FIG. 7 is a graph of a gamma voltage versus gray-scale curve for describing a gray-scale expression scheme in accordance with a first example embodiment of the present disclosure. FIG. 8 is a graph of a luminance versus gray-scale curve based on a gray-scale expression scheme in FIG. 7. FIG. 9 is a graph of an adaptive gamma curve for gray-scale expression in accordance with a first example embodiment of the present disclosure. FIG. 10 illustrates an example configuration of a device in accordance with a first example embodiment of the present disclosure. FIG. 11 is a graph of current versus voltage curves of a drive transistor for describing a driving method of an organic light-emitting display device in accordance with a first example embodiment of the present disclosure.

As shown in FIG. 5 and FIG. 6, in accordance with a first example embodiment of the present disclosure, to reduce power consumption by an organic light-emitting display device, a drive transistor DTFT of a sub-pixel may be driven using a combination of a saturation region and a linear region of a current versus voltage curve.

Further, to reduce power consumption by the organic light-emitting display device, a level of a high level voltage EVDD may be changed to a lower level than a data voltage $V_{DATA}$ forming a data signal.

For example, in accordance with the first example embodiment of the present disclosure, when the drive transistor DTFT generates a current I_oled for driving an organic light-emitting diode OLED, the high level voltage EVDD, which is one of parameters for generating a target current I_target, may be lowered from a P2 level to a P1 level.

When the drive transistor DTFT of the sub-pixel is driven in the linear region of the curve, the high level voltage EVDD may be set at a lower level compared to a related art method Thus, a stress level undergone by the transistor may be reduced compared to the related art method. As a result, deterioration of the transistor may be delayed for a longer time period than in the related art method where the drive transistor is driven in the saturation region.

FIG. 5 illustrates, by way of example, a generally-employed 2T1C configuration where two transistors SW and DTFT and a single capacitor Cst are used to drive an organic light-emitting diode OLED. However, the present disclosure is not limited thereto. Rather, examples of the present disclosure may be applicable to an organic light-emitting display device with a sub-pixel including various pixel circuit configurations.

As shown in FIG. 7 and FIG. 8, the driving method in accordance with the first example embodiment of the present disclosure may employ a linear gamma (Linear GMA) to express low and middle gray-scale ranges and a non-linear gamma (for example, 2.2 GMA) to express high gray-scale range. This is because when an actual pixel is used to express the gray-scales, the drive transistor DTFT may be driven in the saturation region to express the low and middle gray-scale ranges and in the linear region to express the high gray-scale range.

To this end, the driving method in accordance with the first example embodiment of the present disclosure may employ an adaptive gamma curve including an algorithm for determining a gamma change point (GCP). With the adaptive gamma curve, the GCP may be changed in an adaptive manner.

If the gamma is varied along the adaptive gamma curve, the data voltage may be raised without a separate mechanism when the transistor is driven in the linear region drive. If the adaptive gamma curve is employed, the gamma curve may vary depending on the low, middle, and high gray-scale ranges.

As shown in FIG. 9, the gamma change point (GCP) may be determined based on a data voltage level. The data voltage level may be varied even if it is a voltage for expressing the same gray-scale. This is, for example, because a peak data voltage level may vary based on an average picture level (APL) by a peak luminance control (PLC) algorithm.

Because the data voltage level may be different even for the same gray-scale, the gamma change point (GCP) may be determined based on the peak luminance control (PLC) or the average picture level (APL) reference. As a result, the gamma change point (GCP) may shift down to the linear region or up to the non-linear region based on the data voltage level.

As shown in FIG. 9 and FIG. 10, the gamma change point (GCP) may vary based on characteristics of the data voltage level. Thus, to reflect variations in the characteristics of the data voltage level, the organic light-emitting display device may be configured such that the gamma change point (GCP) at a gamma circuit (GMA IC) 135 may be controlled based on a gamma change signal GMAC from the timing controller (T-con) 170.

In this regard, a module or system for changing a driving scheme for the drive transistor may be contained in the timing controller 170. However, the present disclosure is not limited thereto. The module or system for changing the driving scheme for the drive transistor may be formed as a separate circuit, in which case the gamma change signal GMAC may be supplied from the separate circuit.

As shown in FIG. 11, in a method for driving the organic light-emitting display device in accordance with the first example embodiment of the present disclosure, to avoid image quality deterioration resulting from the driving of the drive transistor in the linear region, the driving scheme may be changed for an image data anticipated to have such image quality deterioration.

For example, when an image data which is not expected to have such image quality deterioration is input, a driving scheme is carried out as shown in portion (a) of FIG. 11. That is, the drive transistor is driven in the linear region, and the level of the high level voltage EVDD is changed to a level lower than the level of the data voltage $V_{DATA}$.

On the other hand, when an image data which is expected to have such image quality deterioration is input, a driving scheme is carried out as shown in portion (b) of FIG. 11. That is, the drive transistor is driven in the saturation region, and the level of the high level voltage EVDD is changed to a level higher than the level of the data voltage $V_{DATA}$.

In this regard, to switch the driving schemes of the drive transistor based on whether such image quality deterioration is anticipated for a certain image data, the device may be configured, for example, as discussed below.

Figure 12:
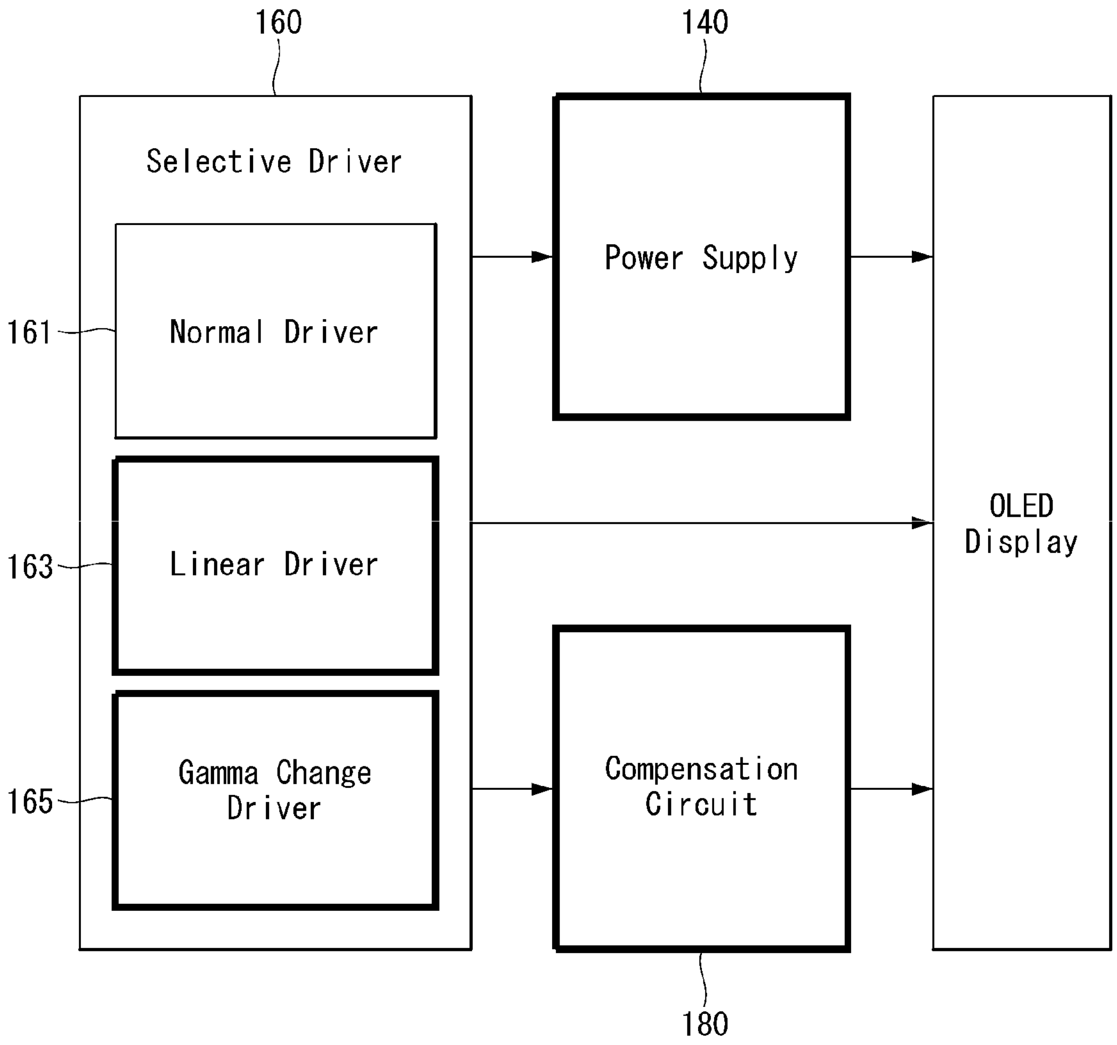
FIG. 12 shows a block diagram of example components of an organic light-emitting display device in accordance with a first example embodiment of the present disclosure.
Figure 13:
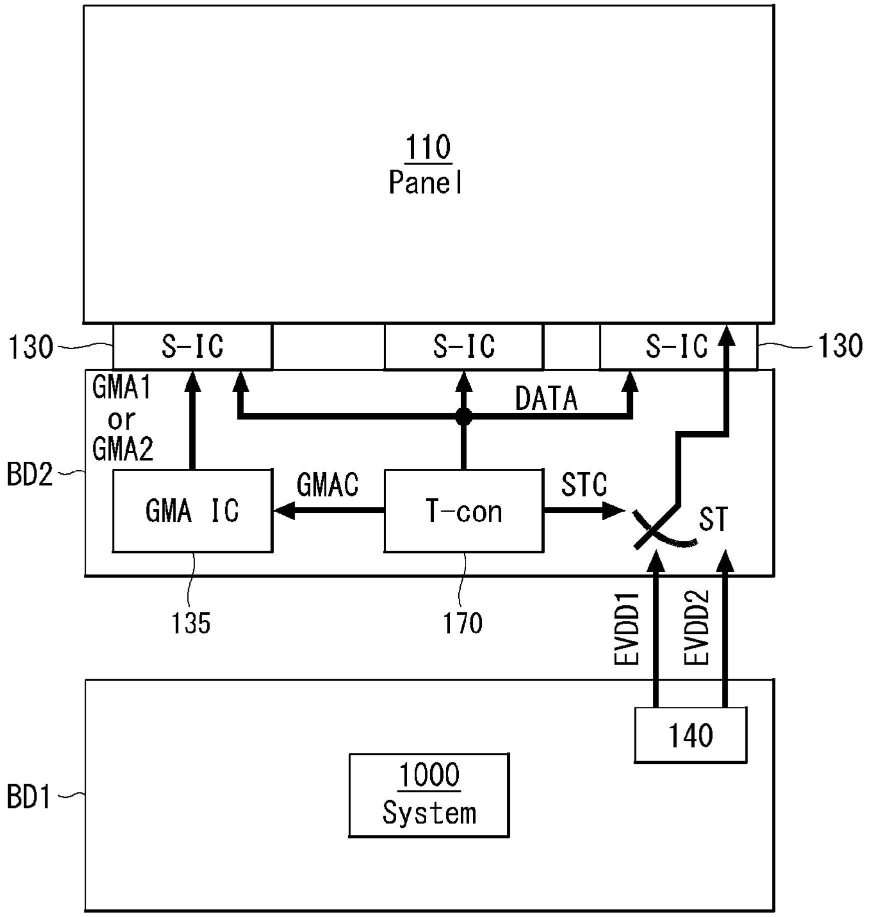
FIG. 13 shows a modular configuration in accordance with a first example of the present disclosure.
Figure 14:
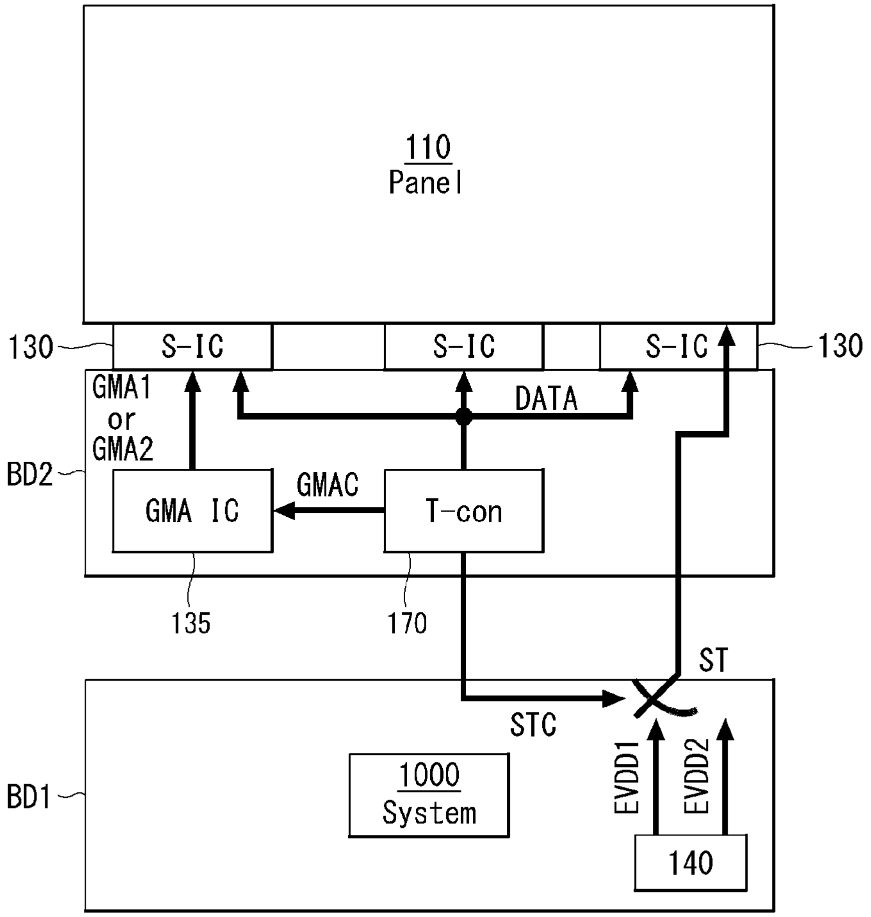
FIG. 14 shows a modular configuration in accordance with a second example of the present disclosure.

FIG. 12 shows a block diagram of example components of an organic light-emitting display device in accordance with a first example embodiment of the present disclosure. FIG. 13 shows a modular configuration in accordance with a first example of the present disclosure. FIG. 14 shows a modular configuration in accordance with a second example of the present disclosure.

As shown in FIG. 12, the organic light-emitting display device in accordance with the first example embodiment of the present disclosure may include a selective driver 160, a power supply 140, and a compensation circuit 180. The selective driver 160 and compensation circuit 180 may be integrated into a single module, for example, into a timing controller.

The selective driver 160 may be configured to enable selective driving of a drive transistor of a sub-pixel between the first and the second driving schemes. In the first driving scheme, for example, the drive transistor of the sub-pixel in a display panel may be driven in a saturation region ($EVDD>V_{DATA}$). In the second driving scheme, for example, the drive transistor of the sub-pixel in the display panel may be driven in the linear region ($EVDD<V_{DATA}$). For enabling such selective driving, the selective driver 160 may include a non-linear driver (or normal driver) 161, a linear driver 163, and a gamma change driver 165.

The non-linear driver 161 may be configured to generate a first drive control signal to instruct the first driving scheme to be carried out. That is, using the first drive control signal, the drive transistor of the sub-pixel in the display panel may be driven in the saturation or non-linear region. In this regard, when the non-linear driver 161 outputs the first drive control signal to the power supply 140, the power supply 140 may be configured to change the level of the high level voltage EVDD to a level higher than the level of the data voltage $V_{DATA}$.

The linear driver 163 may be configured to generate a second drive control signal to instruct the second driving scheme to be carried out. That is, using the second drive control signal, the drive transistor of the sub-pixel in the display panel may be driven in the linear or non-saturation region. In this regard, when the linear driver 163 outputs the second drive control signal to the power supply 140, the power supply 140 may be configured to change the level of the high level voltage EVDD to a level lower than the level of the data voltage $V_{DATA}$.

The linear driver 163 may force the drive transistor of the sub-pixel in the display panel to be driven in the saturation region when an image data with expected image quality deterioration is input. In other words, even if the driving scheme is set to the second driving scheme for the linear driver 163, the linear driver 163 may force performing the first driving scheme in the saturation region, not the second driving scheme in the linear region, when an image data with expected image quality deterioration is input.

To this end, the linear driver 163 may be configured to reference a lookup table which includes parameters of one or more factors for predicting or forecasting image quality deterioration. The lookup table may be stored in a memory as data. Alternatively, the linear driver 163 may be configured to predict the image quality deterioration using an image analysis algorithm.

The factors for predicting or forecasting the image quality deterioration may include, but are not limited to, an average picture level (APL), a total current flowing in the organic light-emitting diode (total EL current), a peak value of the gray-scale, an image complexity, a drive frequency, a cross-talk pattern, and so on. These factors may be provided as parametric threshold values through experiments.

The linear driver 163 may be configured to compare parameter values of the current image data with the parametric threshold values in the lookup table and to enable the drive transistor to be driven in the saturation region, for example, only when the parameter value(s) of the current image data is or are determined to be smaller than the respective parametric threshold value(s).

For example, upon determination that the image quality deterioration is expected to occur, the linear driver 163 may operate together with the non-linear driver 161 such that the first drive control signal from the non-linear driver 161 is changed to a logic high, instead of the second drive control signal from the linear driver 163 being changed to a logic low.

The gamma change driver 165 may be configured to set a gamma based on characteristics parameters in accordance with a predetermined condition for the present device. The gamma change driver 165 may be configured to output a gamma change signal to determine a gamma change point at a gamma circuit based on a change in the driving schemes. The gamma change driver 165 may be configured to output the gamma change signal based on the characteristics parameters such as the peak luminance control (PLC) and/or average picture level (APL).

The compensation module or circuit 180 may be configured to analyze a data signal to be supplied to the display panel, and to compensate and improve for variation of the display panel resulting from the selective driving between the first and the second driving schemes respectively using the saturation region and the linear region. Further, the compensation module or circuit 180 may be configured to compensate for the variation of the display panel resulting from a change in the gamma change point.

Further, the compensation module 180 may be configured to calculate a display panel characteristics variation, for example, an IR drop (a voltage drop due to current and resistance) resulting from the driving in the linear region and then to compensate for the variation. To this end, the compensation module 180 may be configured to generate and output a compensation signal for compensating for the display panel characteristics variation based on an analysis of the data signal and the gamma change signal from the gamma change driver 165.

In accordance with the first example embodiment of the present disclosure, the power consumption of the device may be reduced while the deterioration of the drive transistor may be delayed via the selective driving scheme based on the image quality deterioration estimation. To that end, a drive control signal may be generated to enable selective driving between the first and the second driving schemes for the drive transistor of the sub-pixel, where the first and the second schemes respectively employ the saturation and the linear regions for the drive transistor. Then, based on the selected driving scheme, a gamma change signal may be generated to change the gamma based on the selected driving scheme, and/or a level of a high level voltage (e.g., EVDD) to be supplied to the sub-pixel may be changed.

Hereinafter, an example modular configuration of an organic light-emitting display device will be described where the selective driver 160 and compensation module 180 are incorporated into the timing controller 170.

As shown in FIG. 13 illustrating a first example modular configuration of the organic light-emitting display device, the organic light-emitting display device may be modularized with a first circuit board BD1, a second circuit board BD2, and a display panel 110. The first circuit board BD1 may include a host system 1000 and a power supply 140 disposed thereon. The second circuit board BD2 may include the timing controller 170, the gamma circuit 135, and a voltage switching circuit ST disposed thereon. The voltage switching circuit ST may be disposed inside or outside the power supply 140.

As shown in FIG. 14 illustrating a second example modular configuration of the organic light-emitting display device, the organic light-emitting display device may be modularized with a first circuit board BD1, a second circuit board BD2, and a display panel 110. The first circuit board BD1 may include a host system 1000, a power supply 140 and a voltage switching circuit ST disposed thereon. The second circuit board BD2 may include a timing controller 170 and a gamma circuit 135 disposed thereon. The voltage switching circuit ST may be disposed inside or outside the power supply 140.

The timing controller 170 may be configured to output a switch control signal STC to selectively supply a first high level voltage EVDD1 or a second high level voltage EVDD2 from the power supply 140 disposed on the first circuit board BD1. In one example, the first high level voltage EVDD1 (e.g., a saturation region drive voltage) may be higher than the second high level voltage EVDD2 (e.g., a linear region drive voltage).

The timing controller 170 may be configured to generate a first switch control signal at the same time when the first drive control signal is generated by the non-linear driver disposed therein to drive the drive transistor in the saturation region, that is, a normal driving condition.

Further, the timing controller 170 may be configured to output a gamma change signal GMAC when there is a need for a gamma change. For example, the gamma circuit 135 may be configured to supply a gamma voltage GMA1 complying with a first gamma curve to a data driver 130 based on the gamma change signal GMAC.

When the timing controller 170 has outputted the first drive control signal and the first switch control signal, the voltage switching circuit ST may be configured to operate such that the first high level voltage EVDD1 from the power supply 140 is supplied to the display panel 110. In this way, the display panel 110 may operate based on an operating condition of the saturation region.

The timing controller 170 may be configured to generate a second switch control signal at the same time when the second drive control signal is generated by the linear driver disposed therein to drive the drive transistor in the linear region, that is, a change driving condition.

Further, the timing controller 170 may be configured to output a gamma change signal GMAC when there is a need for a gamma change. For example, the gamma circuit 135 may be configured to supply a gamma voltage GMA2 complying with a second gamma curve to the data driver 130 based on the gamma change signal GMAC.

When the timing controller 170 has outputted the second drive control signal and the second switch control signal, the voltage switching circuit ST may be configured to operate such that the second high level voltage EVDD2 from the power supply 140 is supplied to the display panel 110. In this way, the display panel 110 may operate based on an operating condition of the linear region.

As described above, in accordance with example embodiments of the present disclosure, to change the level of the high level voltage, the voltage switching circuit ST may receive the first and the second high level voltages EVDD1 and EVDD2 from the first circuit board BD1 having the host system 1000 and the power supply 140, and select one of the two high level voltages EVDD1 and EVDD2 based on the computing result (parameter computing result) by the timing controller 170, as illustrated in FIG. 13. Alternatively, the voltage switching circuit ST may receive as a feedback the computing result by the timing controller 170 and select one of the two high level voltages EVDD1 and EVDD2 based on the feedback, as illustrated in FIG. 14. These two approaches are merely examples. As another alternative, for example, the power supply 140 and timing controller 170 both may be disposed on the second circuit board BD2. The present disclosure is not limited to the above example configurations.

A Second Example Embodiment

Figure 15:
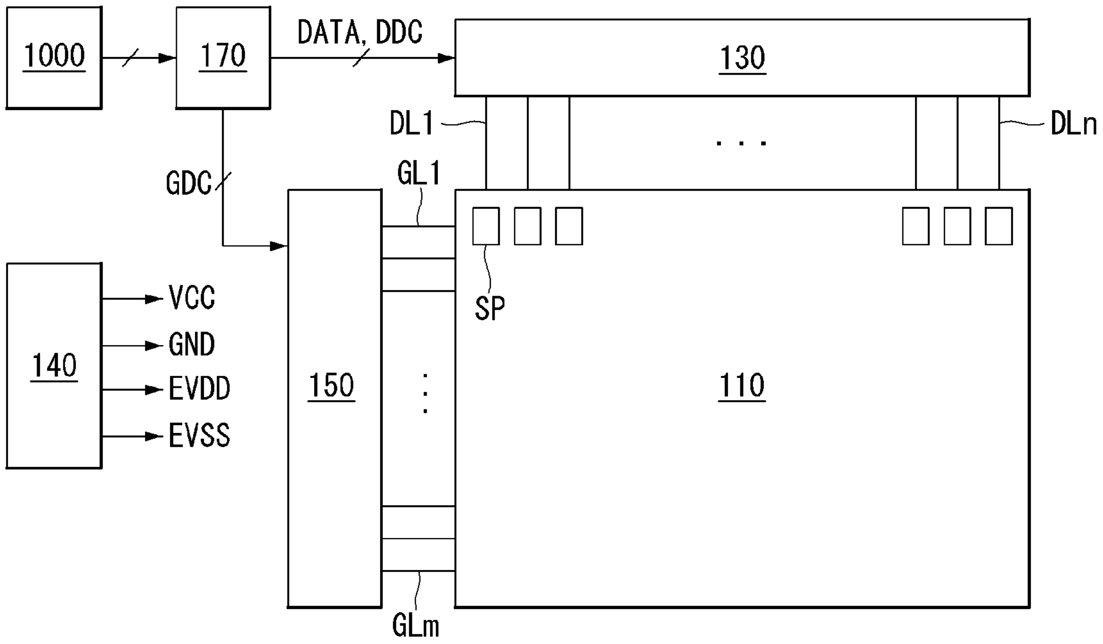
FIG. 15 is a schematic block view of an organic light-emitting display device in accordance with a second example embodiment of the present disclosure.
Figure 16:
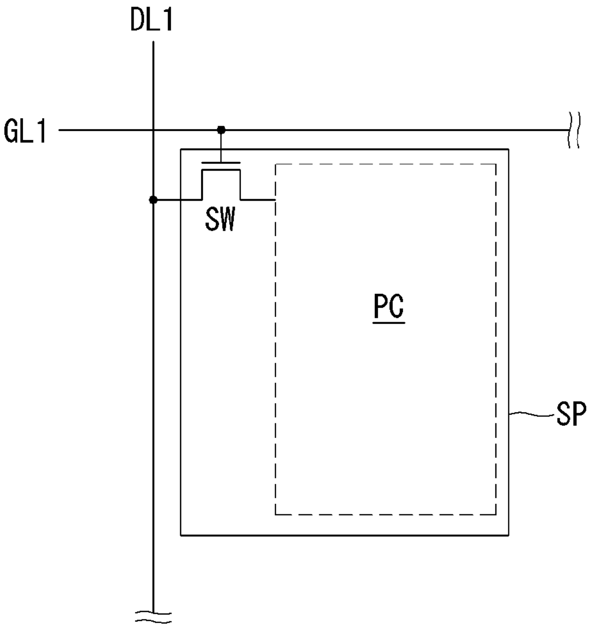
FIG. 16 schematically illustrates a configuration of a sub-pixel in FIG. 15.

FIG. 15 is a schematic block view of an organic light-emitting display device in accordance with a second example embodiment of the present disclosure. FIG. 16 schematically illustrates a configuration of a sub-pixel in FIG. 15.

As shown in FIG. 15, the organic light-emitting display device may include a host system 1000, a timing controller 170, a data driver 130, a power supply 140, a gate driver 150, and a display panel 110.

The host system 1000 may include a SoC (System on Chip) having a scaler disposed therein, and may convert digital video data of an input video to a data signal with a suitable format for display on the display panel 110, and then output the converted data signal. The host system 1000 may supply a variety of timing signals along with the data signal to the timing controller 170.

The timing controller 170 may be configured to control operation timings of the data driver 130 and gate driver 150 based on timing signals from the host system 1000, such as vertical and horizontal synchronization signals, a data enable signal, a main clock signal, etc. The timing controller 170 may be configured to perform video process, such as data compensation, for the data signal from the host system 1000, and then supply the processed or compensated data signal to the data driver 130.

The data driver 130 may be configured to operate based on a data control signal DDC, etc. from the timing controller 170. The data driver 130 may be configured to convert the data signal DATA in a digital form from the timing controller 170 to a data signal in an analog form and then output the analog signal.

In this regard, the data driver 130 may be configured to convert the data signal DATA in a digital form to the data signal in an analog form based on gamma voltages from a gamma circuit inside or outside the data driver 130. The data driver 130 may be configured to supply the analog data signal to data lines DL1 to DLn of the display panel 110.

The gate driver 150 may be configured to operate based on a gate control signal GDC from the timing controller 170. The gate driver 150 may be configured to output a gate signal or a scan signal of a gate high voltage or a gate low voltage.

The gate driver 150 may be configured to sequentially output the gate signal in a forward or reverse direction. The gate driver 150 may be configured to supply the gate signal to gate lines GL1 to GLm of the display panel 110.

The power supply 140 may be configured to output a high level voltage (e.g., a drain voltage) EVDD and a low level voltage (e.g., a source voltage) EVSS for driving the display panel 110, and a collector voltage VCC and a ground voltage GND for driving the data driver 130, etc. Additionally, the power supply 140 may be configured to generate voltages required for operations of the display device, such as the gate high voltage or the gate low voltage to be supplied to the gate driver 150.

The display panel 110 may include sub-pixels SP, the data lines DL1 to DLn coupled to the sub-pixels SP respectively, and the gate lines GL1 to GLm coupled to the sub-pixels SP respectively. The display panel 110 may be configured to display an image based on the gate signal from the gate driver 150 and the data signal from the data driver 130. The display panel 110 may include lower and upper substrates. The sub-pixels SP may be disposed between the lower and upper substrates.

As shown in FIG. 16, a single sub-pixel includes a switching thin film transistor SW coupled to the gate line GL1 and data line DL1 (or disposed at an intersection thereof), and a pixel circuit PC configured to operate based on the data signal supplied via the switching thin film transistor SW. The pixel circuit PC may include a drive transistor, a storage capacitor, an organic light-emitting diode, and a pixel compensation circuit. The pixel compensation circuit may be configured to compensate for at least one of the drive transistor, storage capacitor, and organic light-emitting diode.

The pixel compensation circuit may be configured to compensate for characteristics of the drive transistor (for example, a threshold voltage, current mobility, etc.), and/or characteristics of the organic light-emitting diode (for example, a threshold voltage) and/or for deteriorations thereof. The pixel compensation circuit may operate independently or in association with an external circuit. The pixel compensation circuit may include at least one thin film transistor and capacitor. The pixel compensation circuit can be configured in a wide variety of ways depending on a compensation method. Thus, a specific illustration and description thereof will be omitted.

Figure 17:
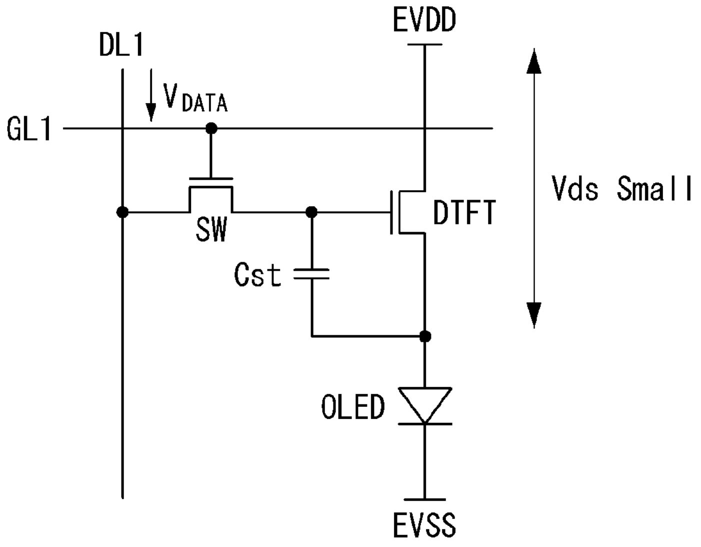
FIG. 17 illustrates a circuit configuration of a sub-pixel in accordance with a second example embodiment of the present disclosure.
Figure 18:
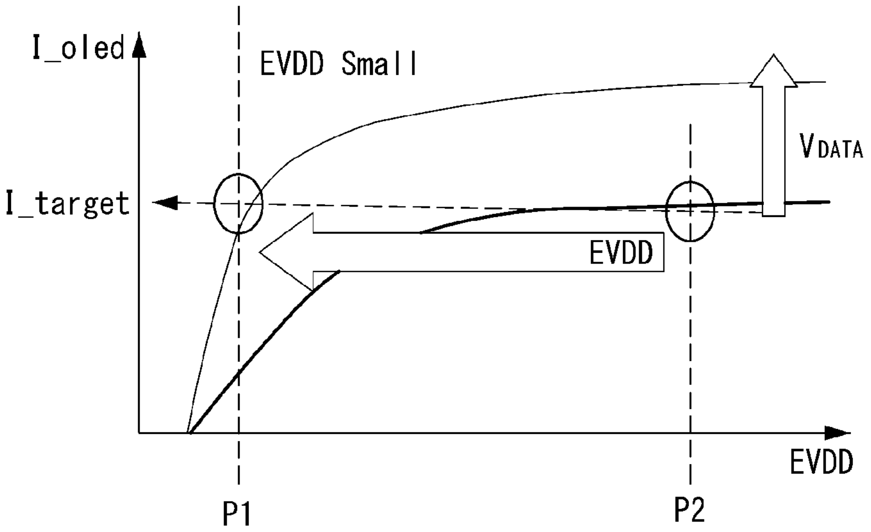
FIG. 18 is a graph of current versus voltage curves of a drive transistor in accordance with a second example embodiment of the present disclosure.
Figure 19:
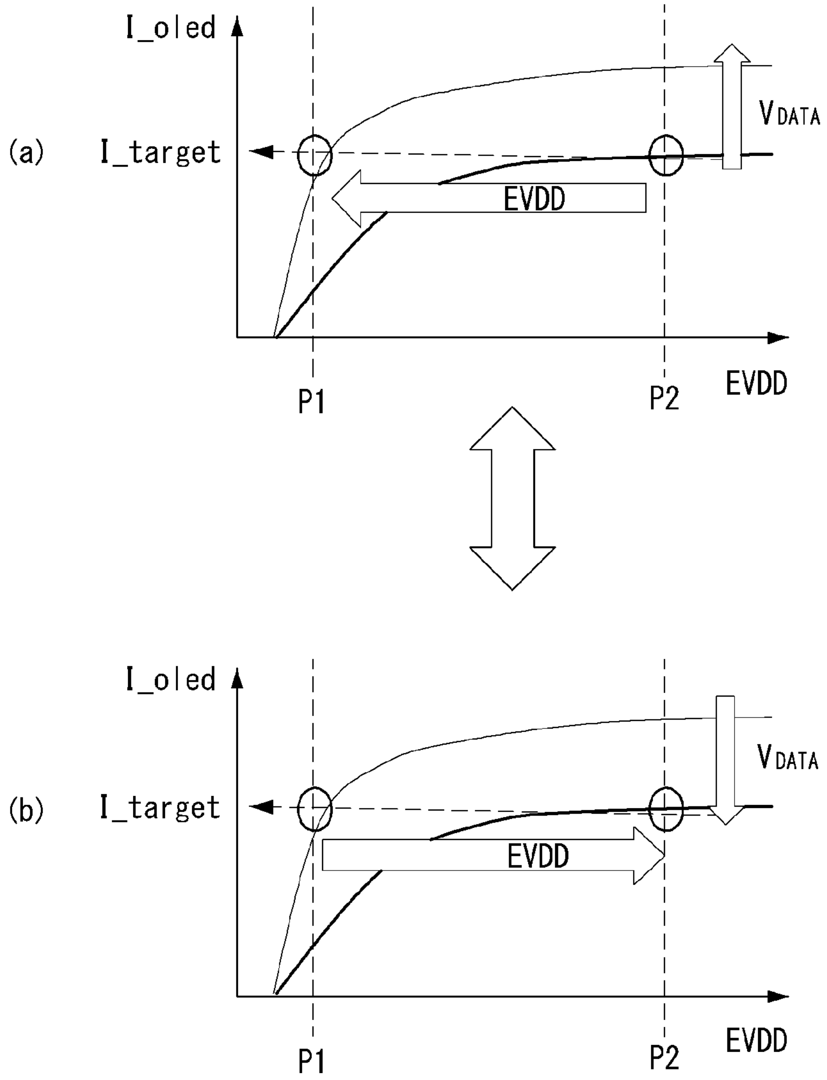
FIG. 19 is a graph of a voltage versus gray-scale curve of a drive transistor for describing a driving method of an organic light-emitting display device in accordance with a second example embodiment of the present disclosure.
Figure 20:
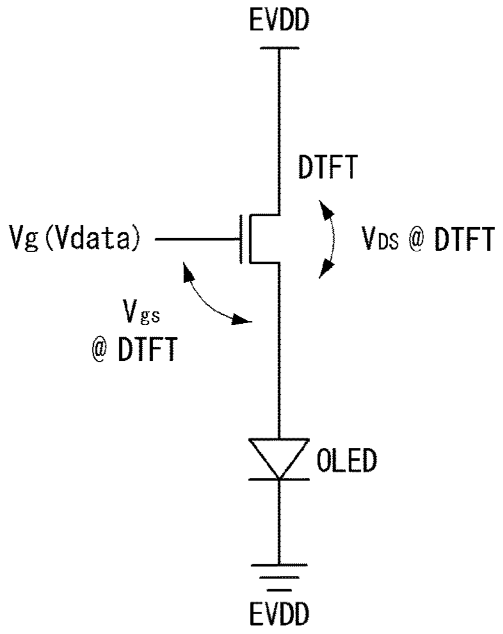
FIG. 20 describes a problem of deterioration of a drive transistor.
Figure 21:
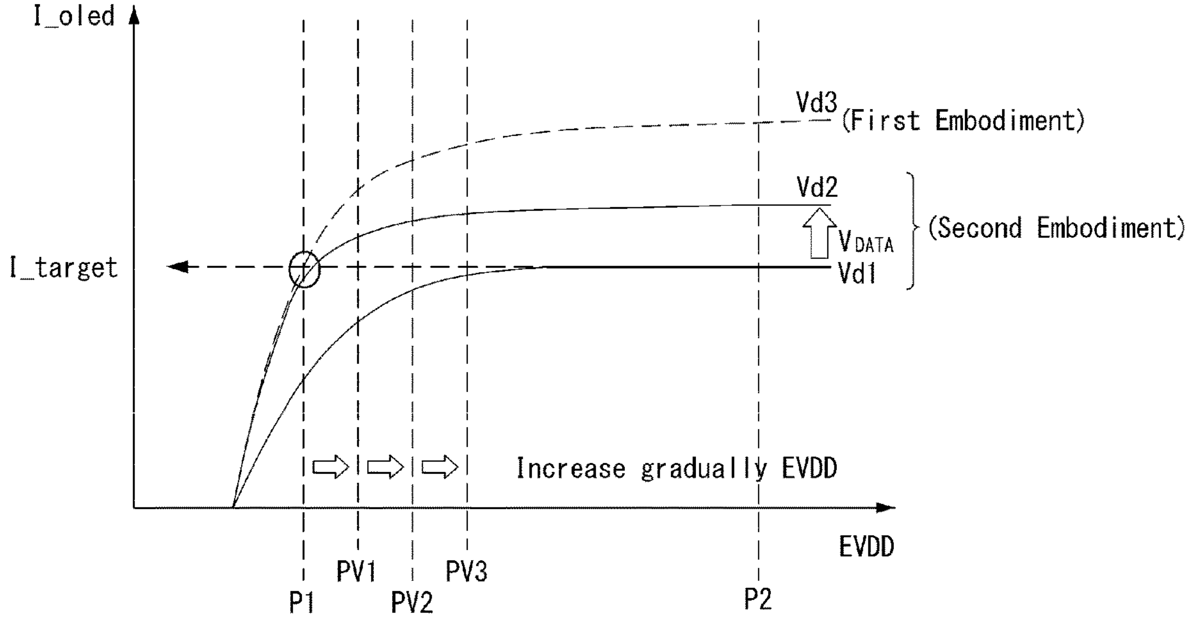
FIG. 21 is a graph of current versus voltage curves for a drive transistor for describing a high level voltage changing scheme in accordance with a second example embodiment of the present disclosure.

FIG. 17 illustrates a circuit configuration of a sub-pixel in accordance with a second example embodiment of the present disclosure. FIG. 18 is a graph of current versus voltage curves of a drive transistor in accordance with a second example embodiment of the present disclosure. FIG. 19 is a graph of a voltage versus gray-scale curve of a drive transistor for describing a driving method of an organic light-emitting display device in accordance with a second example embodiment of the present disclosure. FIG. 20 describes a problem of deterioration of a drive transistor. FIG. 21 is a graph of current versus voltage curves for a drive transistor for describing a high level voltage changing scheme in accordance with a second example embodiment of the present disclosure.

As shown in FIG. 17 and FIG. 18, in accordance with a second example embodiment of the present disclosure, in order to achieve power consumption reduction for the organic light-emitting display device, a drive transistor DTFT of a sub-pixel may be driven using a combination of a saturation region and a linear region of a current versus voltage curve.

Further, in order to achieve power consumption reduction for the organic light-emitting display device, a level of a high level voltage EVDD may be changed to a level lower than a level of a data voltage $V_{DATA}$ forming a data signal.

For example, in accordance with the second example embodiment of the present disclosure, when the drive transistor generates a current I_oled for driving an organic light-emitting diode, a level of the high level voltage EVDD, which is one of the parameters for generating a target current I_target, may be lowered from a P2 level to a P1 level.

When the drive transistor DTFT of the sub-pixel is driven in the linear region of the curve, the level of the high level voltage EVDD may be lowered compared to the related art method. Thus, a stress level undergone by the transistor may be reduced compared to the related art method. As a result, deterioration of the transistor may be expected to be delayed for a longer time period than in the related art method where the drive transistor is driven in the saturation region.

FIG. 17 illustrates, by way of example, a generally-employed 2T1C configuration where two transistors SW and DTFT and a single capacitor Cst are used to drive an organic light-emitting diode OLED. However, the present disclosure is not limited thereto. Rather, the present disclosure may be applicable to an organic light-emitting display device with a sub-pixel including various pixel circuit configurations.

The driving method in accordance with the second example embodiment of the present disclosure, as in the first example embodiment of the present disclosure, may employ a linear gamma (Linear GMA) for expression of low and middle gray-scale ranges, and employ a non-linear gamma (for example, 2.2 GMA) for expression of a high gray-scale range. This is because when expressing the gray-scale using the actual pixel, the drive transistor is driven in the saturation region for the expression of the low and middle gray-scale ranges, and in the linear region for the expression of the high gray-scale range.

As shown in FIG. 19, in a method for driving the organic light-emitting display device in accordance with the second example embodiment of the present disclosure, in order to avoid image quality deterioration resulting from the driving of the drive transistor in the linear region, an image data which is expected to have such image quality deterioration may be subjected to a different driving scheme.

For example, when an image data which is not expected to have such image quality deterioration is input, a driving scheme is carried out as shown in portion (a) of FIG. 19. That is, the drive transistor is driven in the linear region, and the level of the high level voltage EVDD is changed to a level lower than the level of the data voltage $V_{DATA}$.

To the contrary, when an image data which is expected to have such image quality deterioration is input, a driving scheme is carried out as shown in portion (b) of FIG. 19. That is, the drive transistor is driven in the saturation region, and the level of the high level voltage EVDD is changed to a level higher than the level of the data voltage $V_{DATA}$.

However, as can be seen in portion (a) of FIG. 19, it may be necessary to increase the data voltage $V_{DATA}$ to satisfy a target current I_target when the drive transistor is driven in the linear region. As such, an example of the timing in which the data voltage $V_{DATA}$ to satisfy the target current I_target should be increased may by explained as follows.

As shown in FIG. 20, when the driving time of the drive transistor DTFT is continued or a positive voltage is applied continuously to the drive transistor DTFT, a threshold voltage Vth is shifted in a positive direction due to the image quality deterioration. In this case, a Vgs (or Vgs−Vth) of the drive transistor DTFT is lowered gradually, so the data voltage $V_{DATA}$ should be further increased to satisfy the target current I_target.

Therefore, when the threshold voltage of the drive transistor DTFT is shifted in the positive direction due to the image quality deterioration, the data voltage $V_{DATA}$ should be further increased, however, in this case, constraints may arise due to the limited output range of the data driver. That is to say, it may be difficult to cope with a situation where the data driver cannot increase the data voltage $V_{DATA}$ beyond a constant range due to the limited output range.

Additionally, if a problem such as image quality deterioration is caused continuously, the deterioration deviation of the threshold voltage is scattered on a basis of position or sub-pixel of the display panel, which may result in increased screen stain on the display panel and decreased life time of the display panel. According to experiment results, this problem may appear more serious when the drive transistor is driven in the linear region; therefore, in accordance with the second example embodiment of the present disclosure, it may be improved as follows.

As shown in FIG. 21, when an image data which is not expected to have such image quality deterioration is input, the driving transistor is driven in the linear region, and a level of the high level voltage EVDD may be changed to a level lower than a level of the data voltage $V_{DATA}$. At the same time, it may maintain the target current I_target by avoiding the increase in a data voltage $V_{DATA}$ and gradually increasing the level of the high level voltage EVDD depending on the deterioration characteristic of the drive transistor.

That is, in accordance with the second example embodiment of the present disclosure, the drive transistor is driven in the linear region, and the deterioration characteristic of the drive transistor, for example, the threshold voltage is monitored or sensed. Further, when the deterioration characteristic of the drive transistor, for example, the threshold voltage deviates from a reference range (for example, a reference threshold voltage) set inside the timing controller 170, the increase in a data voltage $V_{DATA}$ may be avoided and a level of the high level voltage EVDD may be increased gradually.

To facilitate understanding of the descriptions, a comparison of the first example embodiment with the second example embodiment may be described as follows.

In the first example embodiment, in order to drive the drive transistor in the linear region and generate the target current I_target, a level of the high level voltage EVDD is lowered from P2 level to P1 level, and the data voltage $V_{DATA}$ is increased to Vd3.

In the second example embodiment, in order to drive the drive transistor in the linear region and generate the target current I_target, a level of the high level voltage EVDD is lowered from P2 level to P1 level, and the data voltage $V_{DATA}$ is maintained in a previous level such as Vd1, or increased to Vd2 by a small amount. Further, in the second example embodiment, the deterioration characteristic of the drive transistor, for example, the threshold voltage is monitored or sensed, and in response to changes in the deterioration characteristic of the drive transistor, for example, the threshold voltage, the levels PV1, PV2, PV3 of the high level voltage EVDD are increased gradually.

The levels PV1, PV2, PV3 of the high level voltage EVDD are increased gradually, for example, in a P2 direction in proportion to the changes in the threshold voltage. As such, in the second example embodiment, the levels PV1, PV2, PV3 of the high level voltage EVDD are also changed, taking account of the deterioration characteristic and compensation margin of the drive transistor. At this time, because the gradually changed high level voltage EVDD is commonly supplied to all of the sub-pixels of the display panel, a global compensation effect can be expected.

As explained above, it may be difficult to obtain a margin that can satisfy a target current I_target only by increasing a data voltage $V_{DATA}$, when the threshold voltage of the drive transistor DTFT is changed in a positive direction beyond a constant value, for example, a reference threshold voltage set by the experiment. However, in accordance with the second example embodiment of the present disclosure, a margin being capable of satisfying a target current I_target may be obtained, because it may be possible to perform an additional compensation from the data voltage $V_{DATA}$, when the levels PV1, PV2, PV3 of the high level voltage EVDD are changed in response to changes in the threshold voltage of the drive transistor.

Accordingly, in accordance with the second example embodiment of the present disclosure, it may be possible to secure a compensation range (for example, an output range that may be necessary to compensate for the data voltage) of the data voltage $V_{DATA}$ in a larger width compared to the first example embodiment, because the margin capable of changing the data voltage $V_{DATA}$ is increased.

Figure 22:
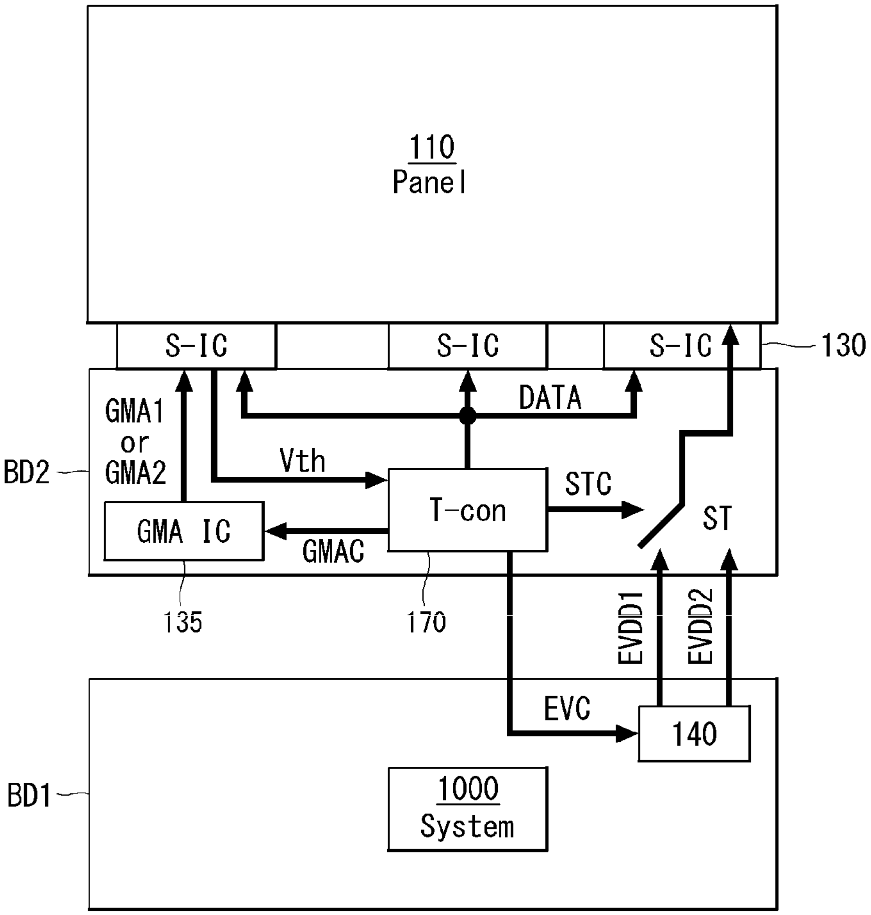
FIG. 22 shows a modular configuration in accordance with a third example of the present disclosure.
Figure 23:
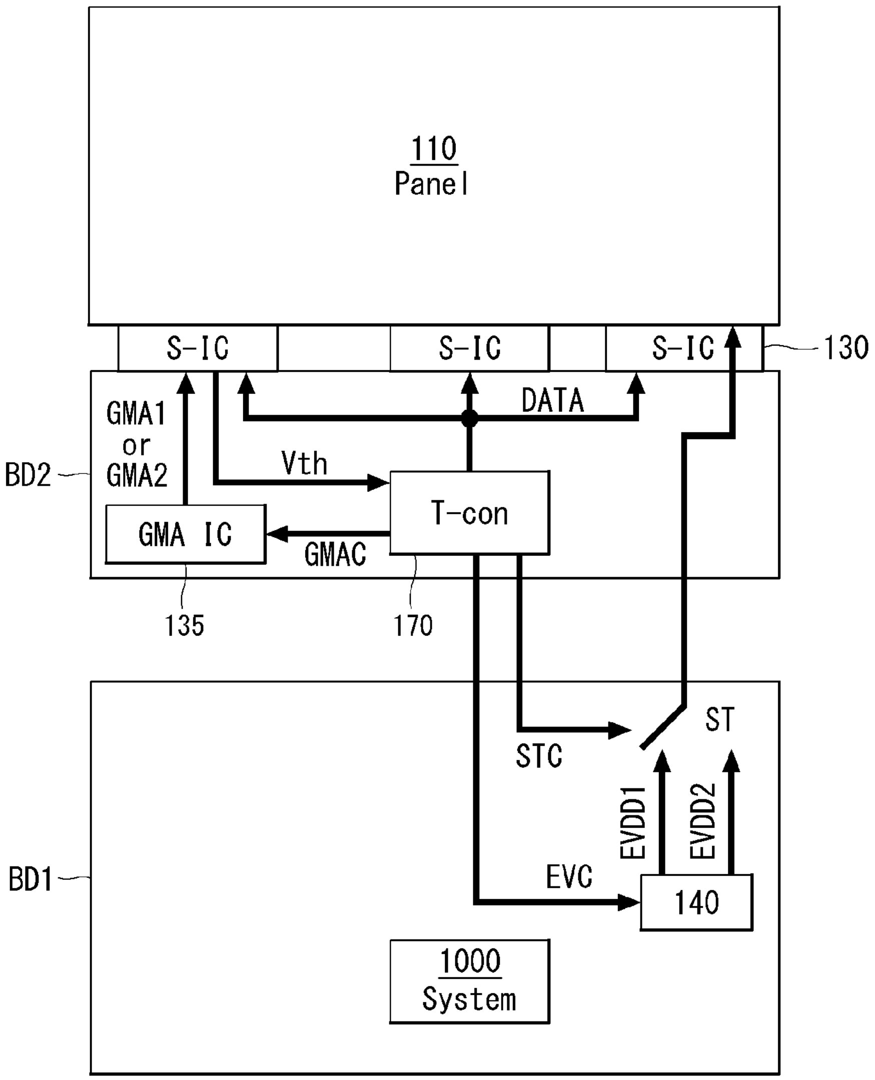
FIG. 23 shows a modular configuration in accordance with a fourth example of the present disclosure.

In this connection, as in the second example embodiment, in order to switch the driving schemes of the drive transistor based on whether such an image quality problem occurs for a certain image data, and change the level of high level voltage EVDD gradually, the present device may be configured as follows:

FIG. 22 shows a modular configuration in accordance with a third example of the present disclosure. FIG. 23 shows a modular configuration in accordance with a fourth example of the present disclosure.

As shown in FIG. 22, illustrating a third example modular configuration of an organic light-emitting display device, the organic light-emitting display device may be modularized with a first circuit board BD1, a second circuit board BD2, and a display panel 110. The first circuit board BD1 may include a system 1000 and a power supply 140 disposed thereon. The second circuit board BD2 may include a timing controller 170, a gamma circuit 135, and a voltage switching circuit ST disposed thereon. The voltage switching circuit ST may be disposed inside or outside the power supply 140. The gamma circuit 135 may perform the same or similar functions or operations as those shown and described in the first example or the second example. Thus, the descriptions thereof may be discussed with reference to the portion of the first example or the second example of the present disclosure.

As shown in FIG. 23, illustrating a fourth example modular configuration of the organic light-emitting display device, the organic light-emitting display device may be modularized with a first circuit board BD1, a second circuit board BD2, and a display panel 110. The first circuit board BD1 may include a host system 1000, a power supply 140, and a voltage switching circuit ST disposed thereon. The second circuit board BD2 may include a timing controller 170 and a gamma circuit 135 disposed thereon. The voltage switching circuit ST may be disposed inside or outside the power supply 140. The gamma circuit 135 may perform the same or similar functions or operations as those shown and described in the first example or the second example. Thus, the descriptions thereof may be discussed with reference to the portion of the first example or the second example of the present disclosure.

The timing controller 170 may be configured to output a switch control signal STC to selectively supply a first high level voltage EVDD1 and a second high level voltage EVDD2 from the power supply 140 disposed on the first circuit board BD1. In one example, the first high level voltage EVDD1 (e.g., a saturation region drive voltage) may be higher than the second high level voltage EVDD2 (e.g., a linear region drive voltage).

The timing controller 170 may be configured to generate a first switch control signal at the same time when a first drive control signal is generated by a non-linear driver disposed therein, wherein the first drive control signal enables driving for the drive transistor in a saturation region, that is, a normal driving condition.

When the timing controller 170 has outputted the first drive control signal and first switch control signal, the voltage switching circuit ST may be configured to operate such that the first high level voltage EVDD1 from the power supply 140 is supplied to the display panel 110. In this way, the display panel 110 may operate based on an operation condition of the saturation region.

The timing controller 170 may be configured to generate a second switch control signal at the same time when a second drive control signal is generated by a linear driver disposed therein, wherein the second drive control signal enables driving for the drive transistor in a linear region, that is, a change driving condition.

Further, the timing controller 170 monitors or senses deterioration characteristics of the drive transistor, for example, Vth continuously, and generates a power variable signal EVC to increase a level of a high level voltage EVDD gradually based on the deterioration characteristic of the drive transistor, for example, Vth. At this time, the timing controller 170 performs compensation operations to avoid an increase in a data voltage $V_{DATA}$ and gradually increase the level of the high level voltage EVDD, when the deterioration characteristic of the drive transistor, for example, Vth deviates from a reference range (a reference threshold voltage) set inside the timing controller 170.

When the timing controller 170 has outputted the second drive control signal and second switch control signal, the voltage switching circuit ST may be configured to operate such that the second high level voltage EVDD2 from the power supply 140 is supplied to the display panel 110. In this way, the display panel 110 may operate based on an operation condition of the linear region. When the timing controller 170 has outputted the power variable signal EVC, the power supply 140 changes a level of the second high level voltage EVDD2 based on the compensation operations by the timing controller 170 and outputs the level.

A Third Example Embodiment

Figure 24:
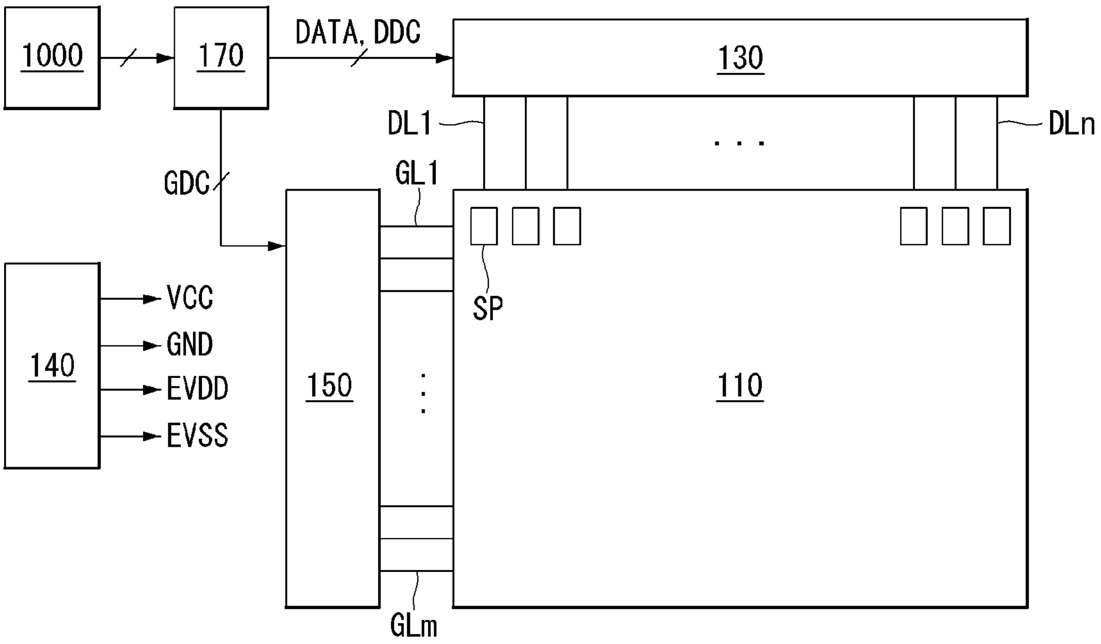
FIG. 24 is a schematic block view of an organic light-emitting display device in accordance with a third example embodiment of the present disclosure.
Figure 25:
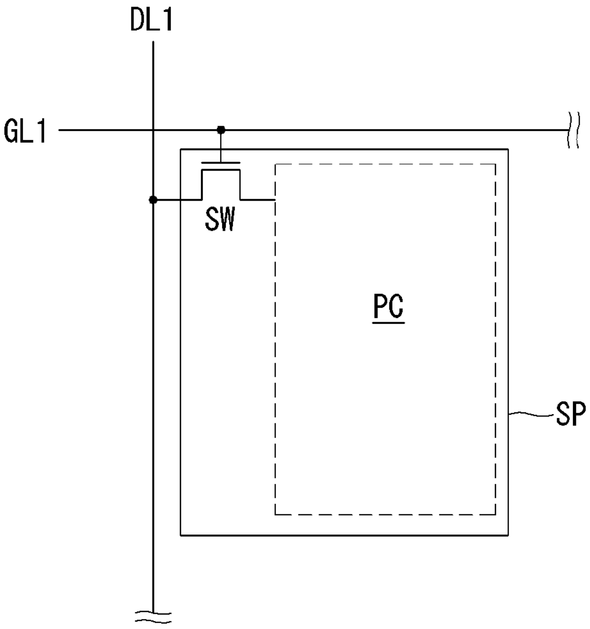
FIG. 25 schematically illustrates a configuration of a sub-pixel in FIG. 24.

FIG. 24 is a schematic block view of an organic light-emitting display device in accordance with a third example embodiment of the present disclosure. FIG. 25 schematically illustrates a configuration of a sub-pixel in FIG. 24.

As shown in FIG. 24, the organic light-emitting display device may include a host system 1000, a timing controller 170, a data driver 130, a power supply 140, a gate driver 150, and a display panel 110.

The host system 1000 may include a SoC (System on Chip) having a scaler disposed therein, and may convert digital video data of an input video to a data signal with a suitable format for display on the display panel 110, and then output the converted data signal. The host system 1000 may supply a variety of timing signals along with the data signal to the timing controller 170.

The timing controller 170 may be configured to control operation timings of the data driver 130 and gate driver 150 based on the timing signals from the host system 1000, such as based on vertical and horizontal synchronization signals, a data enable signal, a main clock signal, etc. The timing controller 170 may be configured to perform a video process, such as data compensation, for the data signal from the host system 1000, and then supply the processed or compensated data signal to the data driver 130.

The data driver 130 may be configured to operate based on a data control signal DDC, etc. from the timing controller 170. The data driver 130 may be configured to convert the data signal DATA in a digital form from the timing controller 170 to a data signal in an analog form and then output the converted data signal.

In this regard, the data driver 130 may be configured to convert the data signal DATA in a digital form to the data signal in an analog form based on gamma voltages from a gamma circuit inside or outside the data driver 130. The data driver 130 may be configured to supply the analog data signal to data lines DL1 to DLn of the display panel 110.

The gate driver 150 may be configured to operate based on a gate control signal GDC from the timing controller 170. The gate driver 150 may be configured to output a gate signal or a scan signal of a gate high voltage or a gate low voltage.

The gate driver 150 may be configured to sequentially output the gate signal in a forward or reverse direction. The gate driver 150 may be configured to supply the gate signal to gate lines GL1 to GLm of the display panel 110.

The power supply 140 may be configured to output a high level voltage (e.g., a drain voltage) EVDD and a low level voltage (e.g., a source voltage) EVSS for driving the display panel 110, and a collector voltage VCC and a ground voltage GND for driving the data driver 130, etc. Additionally, the power supply 140 may be configured to generate voltages required for operations of the display device, such as the gate high voltage or the gate low voltage to be supplied to the gate driver 150.

The display panel 110 may include sub-pixels SP, the data lines DL1 to DLn coupled to the sub-pixels SP respectively, and the gate lines GL1 to GLm coupled to the sub-pixels SP respectively. The display panel 110 may be configured to display an image based on the gate signal from the gate driver 150 and the data signal from the data driver 130. The display panel 110 may include lower and upper substrates. The sub-pixels SP may be disposed between the lower and upper substrates.

As shown in FIG. 25, a single sub-pixel includes a switching thin film transistor SW coupled to the gate line GL1 and data line DL1 (or disposed at an intersection thereof), and a pixel circuit PC configured to operate based on the data signal supplied via the switching thin film transistor SW. The pixel circuit PC may include a drive transistor, a storage capacitor, an organic light-emitting diode, and a pixel compensation circuit. The pixel compensation circuit may be configured to compensate for at least one of the drive transistor, storage capacitor, and organic light-emitting diode.

The pixel compensation circuit may be configured to compensate for characteristics of the drive transistor (for example, a threshold voltage, current mobility, etc.), and/or characteristics of the organic light-emitting diode (for example, a threshold voltage) and/or for deteriorations thereof. The pixel compensation circuit may operate independently or in association with an external circuit. The pixel compensation circuit may include at least one thin film transistor and capacitor. The pixel compensation circuit can be configured in a wide variety of ways depending on a compensation method. Thus, a specific illustration and description thereof will be omitted.

Figure 26:
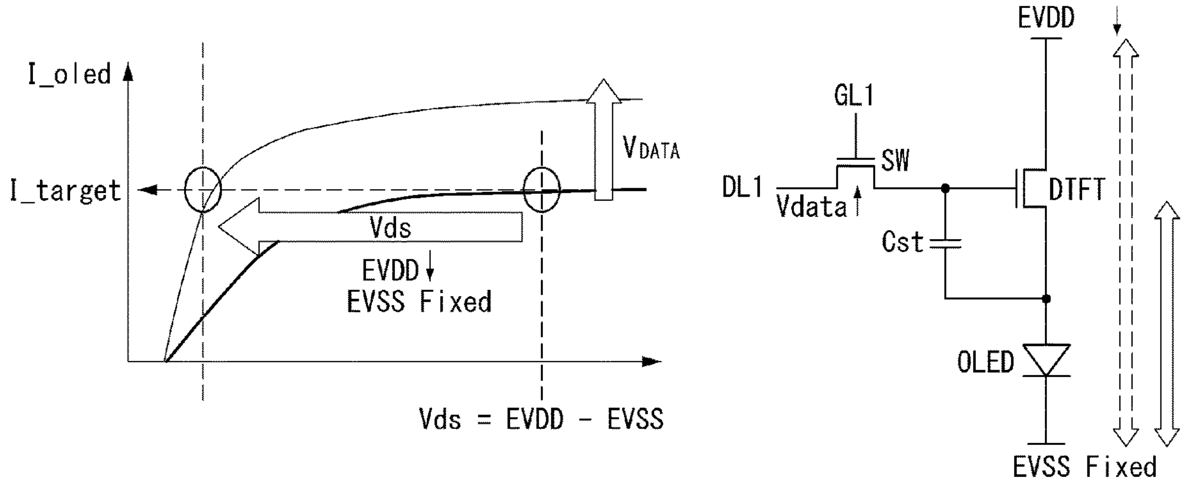
FIGS. 26 and 27 are diagrams for describing a comparison between a scheme of changing a level of a high level voltage and a scheme of changing a level of a low level voltage in order to drive a drive transistor in a linear region and generate a target current.
Figure 27:
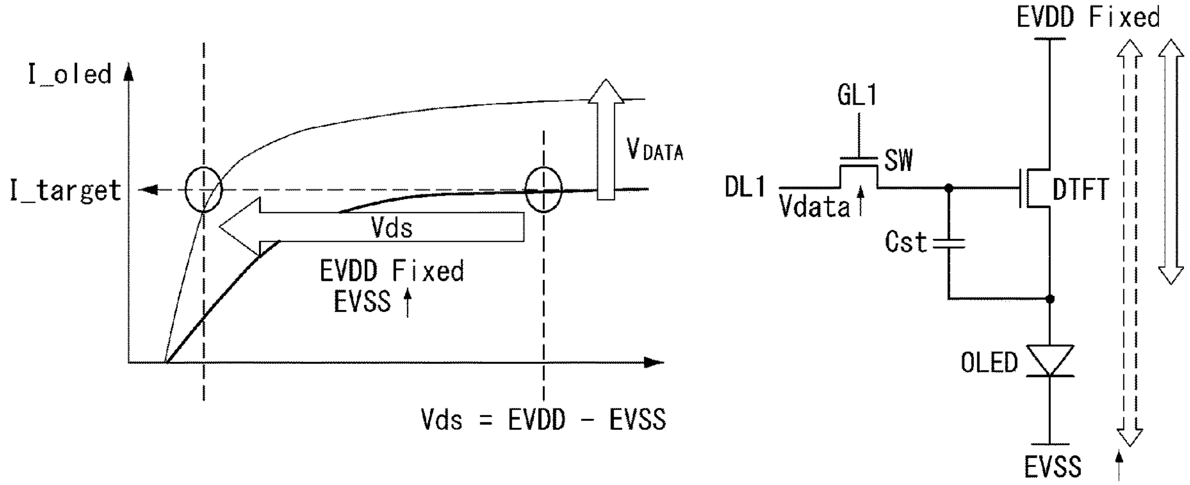
Figure 28:
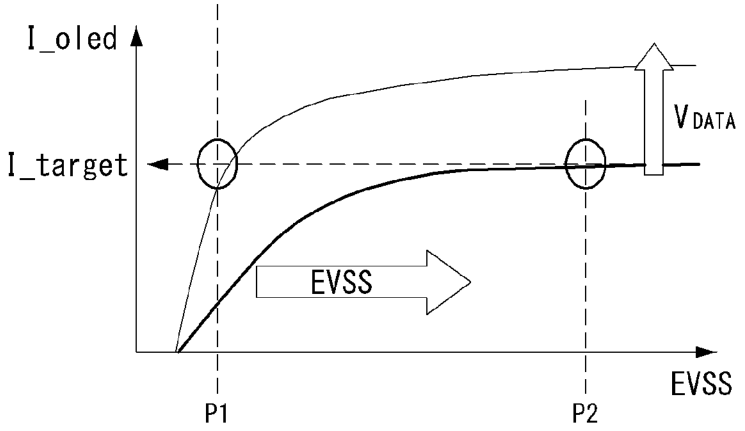
FIG. 28 is a graph of current versus voltage curves of a drive transistor for describing a driving method of an organic light-emitting display device in accordance with a third example embodiment of the present disclosure.
Figure 29:
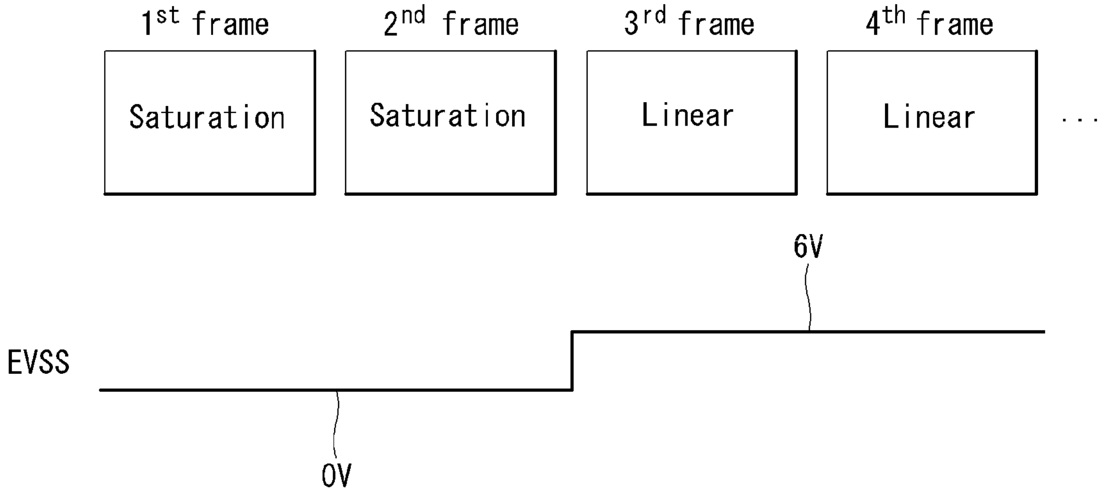
FIGS. 29 and 30 are views illustrating examples of changing a low level voltage in accordance with a third example embodiment of the present disclosure.
Figure 30:
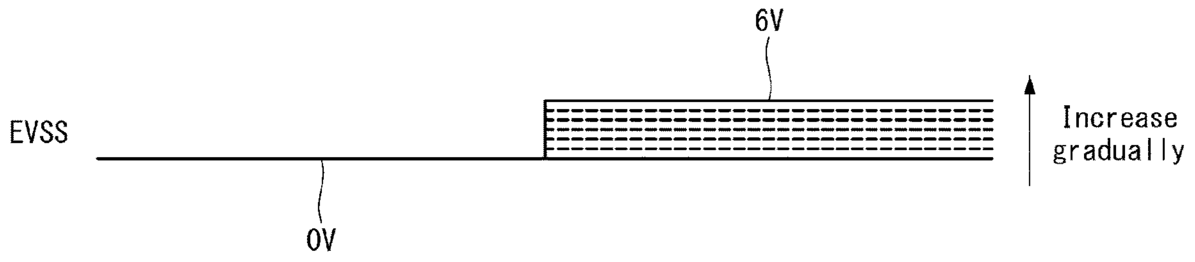

FIGS. 26 and 27 are diagrams for describing a comparison between a scheme of changing a level of a high level voltage and a scheme of changing a level of a low level voltage in order to drive a drive transistor in a linear region and generate a target current. FIG. 28 is a graph of current versus voltage curves of a drive transistor for describing a driving method of an organic light-emitting display device in accordance with a third example embodiment of the present disclosure. FIGS. 29 and 30 are views illustrating examples of changing a low level voltage in accordance with a third example embodiment of the present disclosure.

As shown in FIG. 26, the second example embodiment lowers a level of a high level voltage EVDD to drive a drive transistor DTFT in a linear region and generate a target current I_target, but maintains a data voltage $V_{DATA}$ at a previous level or slightly increases the data voltage $V_{DATA}$ from the previous level. To this end, the second example embodiment changes the high level voltage EVDD while a low level voltage EVSS is fixed.

As shown in FIG. 27, the third example embodiment increases a level of the low level voltage EVSS to drive the drive transistor DTFT in the linear region and generate the target current I_target, but maintains the data voltage $V_{DATA}$ at the previous level or slightly increases the data voltage $V_{DATA}$ from the previous level. To this end, the third example embodiment changes the low level voltage EVSS while the high level voltage EVDD is fixed.

As can be seen from FIGS. 26 and 27, a drain-source voltage Vds of the drive transistor DTFT=the high level voltage EVDD−the low level voltage EVSS is also defined in the third example embodiment as well as the second example embodiment. That is, when one of the level of the high level voltage EVDD and the level of the low level voltage EVSS is lowered, the drain-source voltage Vds of the drive transistor DTFT is also lowered. Therefore, because a method of changing the level of the high level voltage EVSS as well as a method of changing the level of the high level voltage EVDD changes the voltage depending on a change of a threshold voltage of the drive transistor DTFT, both example embodiments may improve life time of the product.

FIG. 27 illustrates, by way of example, a generally-employed 2T1C configuration where two transistors SW and DTFT and a single capacitor Cst are used to drive an organic light-emitting diode OLED. However, the present disclosure is not limited thereto. Rather, the present disclosure may be applicable to an organic light-emitting display device with a sub-pixel including various pixel circuit configurations.

As shown in FIG. 28, in accordance with the third example embodiment of the present disclosure, in order to achieve power consumption reduction for the organic light-emitting display device, the drive transistor DTFT of the sub-pixel may be driven using a combination of a saturation region and a linear region of a current versus voltage curve. Further, in order to achieve power consumption reduction for the organic light-emitting display device, a level of the low level voltage EVSS may be changed in response to a change of the data voltage $V_{DATA}$ constituting a data signal.

For example, in accordance with the third example embodiment of the present disclosure, when the drive transistor generates a current I_oled for driving the organic light-emitting diode, the level of the low level voltage EVSS, which is one of the conditions for generating the target current I_target, becomes higher than P1. However, this condition is satisfied when the drive transistor DTFT is driven in the linear region rather than the saturation region.

As shown in first and second frames (1st frame, 2nd frame) of FIG. 29, when the drive transistor DTFT is driven in the saturation region, the level of the low level voltage EVSS is maintained at 0V level.

As shown in third and fourth frames (3rd frame, 4th frame) in FIG. 29, when the drive transistor DTFT is driven in the linear region, the level of the low level voltage EVSS is maintained at a level of 6V. Here, the voltage level of 6V should be understood as an example.

As shown in FIG. 30, when driving the drive transistor DTFT in the linear region, the level of the low level voltage EVSS may gradually increase from 0V to 6V. As described above, the level of the low level voltage EVSS changes gradually instead of 0V or 6V in consideration of an image quality problem. The method of gradually changing the level of the low level voltage EVSS is for considering deterioration characteristics and compensation margin of the drive transistor DTFT. Also, because the gradually changed low level voltage EVSS is commonly supplied to all of the sub-pixels of a display panel, a global compensation effect may be expected.

When the drive transistor DTFT of the sub-pixel is driven in the linear region, the level of the low level voltage EVSS is maintained or higher than the previous level while the level of the high level voltage EVDD is fixed. Thus, a stress level undergone by the transistor may be reduced compared to a related art method. As a result, the deterioration of the transistor may be expected to be delayed by a longer time period than in the related art method where the drive transistor is driven in the saturation region.

The third example embodiment controls a circuit that generates the low level voltage EVSS, not a circuit that generates the high level voltage EVDD with a relatively high power consumption and a complicated device configuration. Because the circuit for changing the high level voltage may include a large number of components, and variability of the variable voltage may be large and unstable when the voltage is changed, there is a variety of burdens in the circuit for changing the high level voltage. On the other hand, the circuit for changing the low level voltage may be less burdensome than the circuit for changing the high level voltage, because of fewer components and less variability or instability when the voltage is changed. Therefore, the third example embodiment may further reduce the power consumption as compared with the second example embodiment, and facilitate the configuration and implementation of the circuit.

In addition, because the third example embodiment changes the low level voltage, it may be possible to design a power supply capable of outputting and changing the voltage by only one converter, thereby having excellent economical efficiency (e.g., reduction in manufacturing cost). Because the third example embodiment changes the low level voltage that is not a high power consumption voltage such as the high level voltage, it may be expected to achieve high stability and high power consumption efficiency compared with a method of changing the high level voltage.

Figure 31:
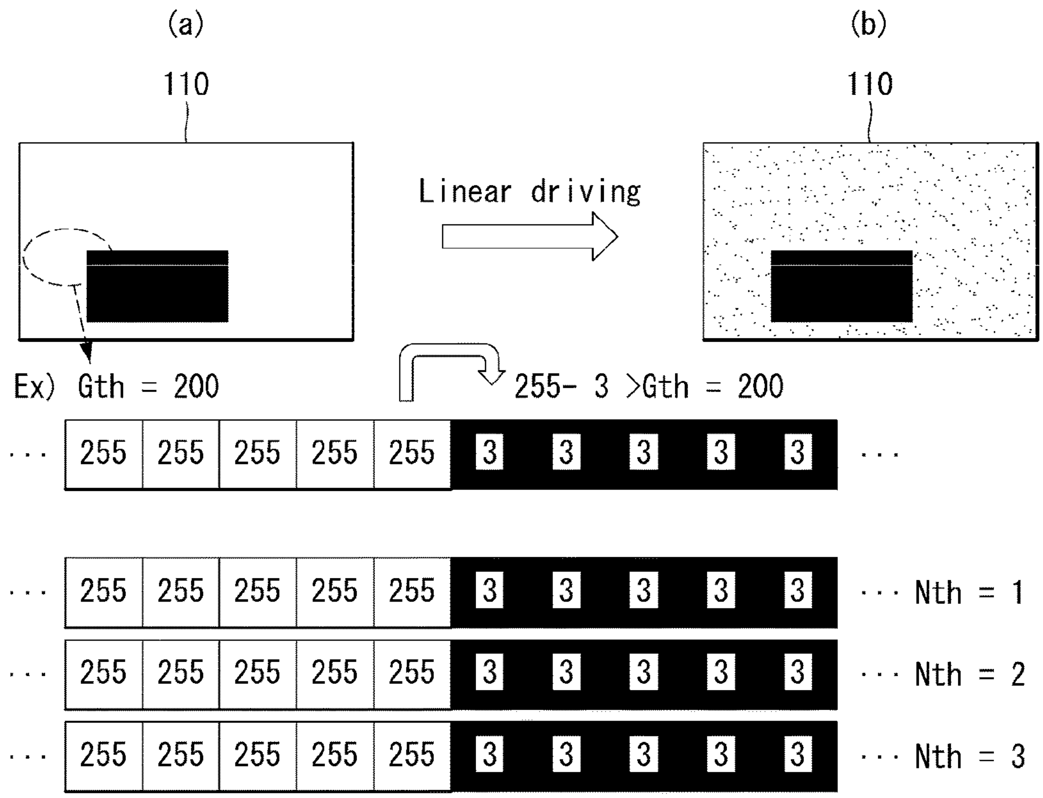
FIG. 31 is a view for explaining a method for determining whether an image quality problem has occurred when driving a drive transistor in a linear region.
Figure 32:
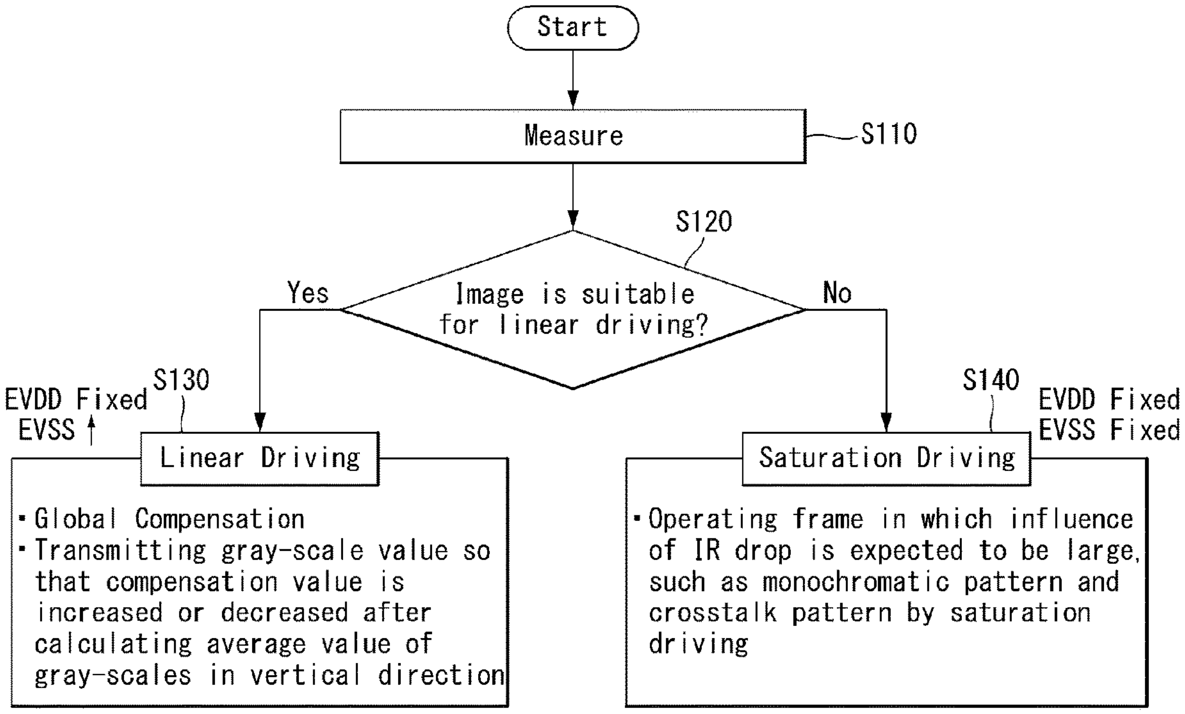
FIG. 32 is a flowchart for explaining a selection scheme of linear driving and saturation driving in accordance with a third example embodiment of the present disclosure.

FIG. 31 is a view for explaining a method for determining whether an image quality problem has occurred when driving a drive transistor in a linear region. FIG. 32 is a flowchart for explaining a selection scheme of linear driving and saturation driving in accordance with a third example embodiment of the present disclosure.

As shown in FIG. 31, when an image is displayed on a display panel 110, there is a pattern that causes a luminance deviation due to an influence of an IR drop (a voltage drop due to current and resistance). The pattern occurs when there is a vertical line where a deviation of a data voltage is large. Generally, when a black box on a white background is displayed on the display panel 110, a crosstalk which is an image quality problem due to the deviation of the data voltage occurs.

When an image capable of causing the image quality problem is displayed on the display panel 110, if a driving transistor is driven in a linear region, an image quality is lowered further (see the display panel of portion (a) of FIG. 31 and the display panel of portion (b) of FIG. 31.

In order to solve this problem, it may be necessary to determine whether an input image data causes the image quality problem based on an image analysis algorithm. A confidence measure for determining presence or absence of an image having a large influence by the IR drop will be described as follows.

First, a gray threshold value Gth may be set so that a portion where a data transition of an input data voltage shows a large width can be filtered. For example, the gray threshold value can be algorithmized to detect a portion where the gray difference appears larger than the gray threshold value Gth.

When the gray threshold value Gth is set to Gth=200 as shown in FIG. 31, moving from the white background 255 to the black box 3, the difference between these values appears as "255−3>Gth=200". Therefore, this image is determined to be an image which is expected to cause the crosstalk, which is the image quality problem due to the deviation of the data voltage.

It is determined whether the image is a suitable image for linear driving or a suitable image for saturation driving based on a result of counting whether the number of patterns corresponding to the image causing the crosstalk in one frame as described above is greater than or less than a preset line or an area threshold (N Line/Area Threshold; Nth and N is a natural number). At this time, an image in which the linear driving is not suitable is switched to the saturation driving depending on the result of the final determination.

As shown in FIG. 32, in a method of driving an organic light emitting display device in accordance with the third example embodiment, an input image is measured in order to extract a frame having a large influence of an IR drop (S110). The method of measuring the input image may be based on an algorithm by setting a threshold value as shown in FIG. 31, but the present disclosure is not limited thereto.

After the input image is measured, it is determined whether the image is suitable for the linear driving or the saturation driving (S120). The method of determining the suitable image for the linear driving or the suitable image for the saturation driving may be performed by setting the threshold value as described with reference to FIG. 31 and algorithmizing it, but the present disclosure is not limited thereto.

In the linear driving method, a low level voltage EVSS may be changed in a state where a high level voltage EVDD is fixed (S130). The linear driving scheme has a global compensation effect. After calculating an average value of gray-scales in a vertical direction, a gray-scale value can be transmitted so that a compensation value is increased or decreased based on the average value.

In the saturation driving scheme, the high level voltage EVDD and the low level voltage EVSS may be fixed (S140). The saturation driving scheme is limited to a frame in which the influence of the IR drop is expected to be large, such as a monochromatic pattern and a crosstalk pattern.

As in the third example embodiment, when the display panel is driven by dividing a display area into the linear region and the saturation region by frame depending on characteristics of an image, it may be possible to avoid image quality problems such as deviation in vertical luminance and crosstalk due to the IR drop, as well as reduction in power consumption.

As in the third example embodiment, in order to switch selectively the driving scheme of the drive transistor based on whether such an image quality problem occurs for a certain image data, and change a level of the low level voltage EVSS gradually, the present device may be configured as follows.

Figure 33:
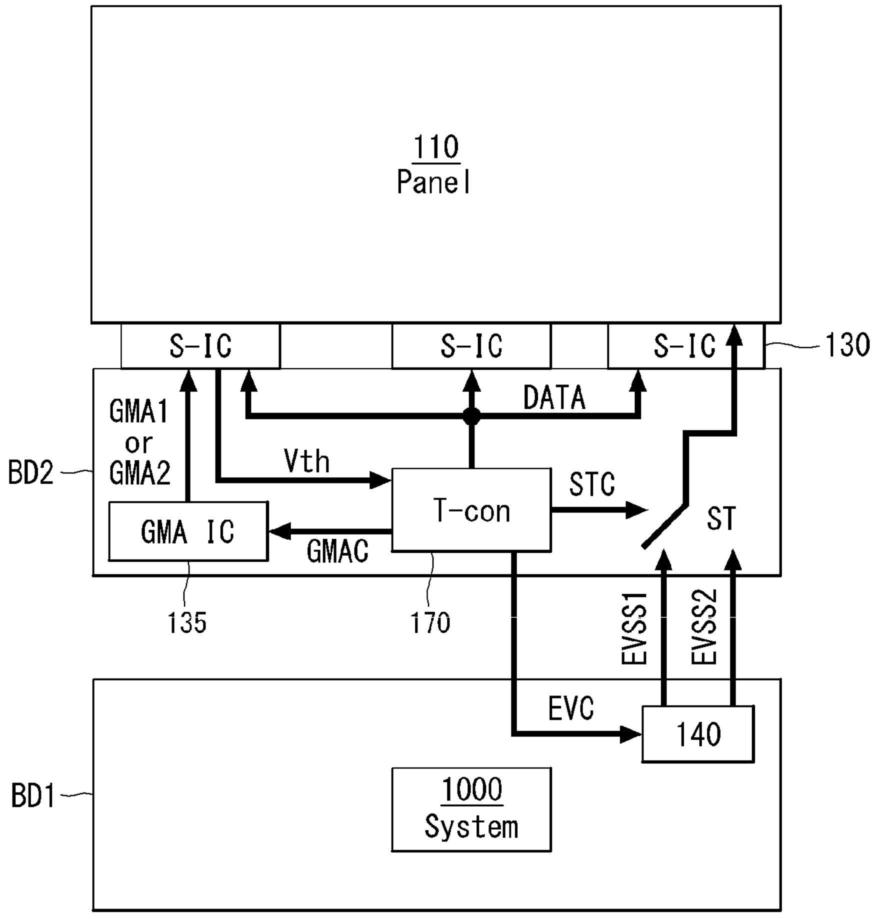
FIG. 33 shows a modular configuration in accordance with a fifth example of the present disclosure.
Figure 34:
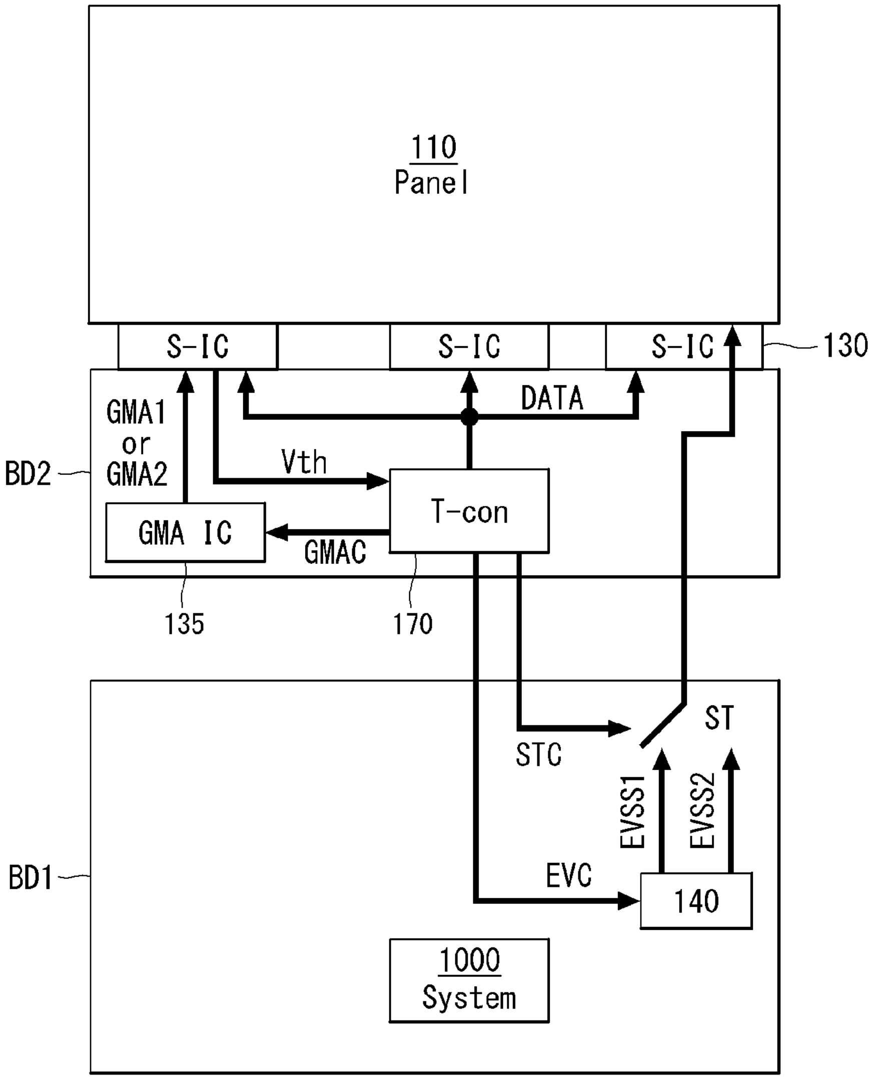
FIG. 34 shows a modular configuration in accordance with a sixth example of the present disclosure.

FIG. 33 shows a modular configuration in accordance with a fifth example of the present disclosure. FIG. 34 shows a modular configuration in accordance with a sixth example of the present disclosure.

As shown in FIG. 33, illustrating a fifth example modular configuration of an organic light-emitting display device, the organic light-emitting display device may be modularized with a first circuit board BD1, a second circuit board BD2, and a display panel 110. The first circuit board BD1 may include a host system 1000 and a power supply 140 disposed thereon. The second circuit board BD2 may include a timing controller 170, a gamma circuit 135, and a voltage switching circuit ST disposed thereon. The voltage switching circuit ST may be disposed inside or outside the power supply 140. The gamma circuit 135 may perform the same or similar functions or operations as those shown and described in the first example or the second example. Thus, the descriptions thereof may be discussed with reference to the portion of the first example or the second example of the present disclosure.

As shown in FIG. 34, illustrating a sixth example modular configuration of the organic light-emitting display device, the organic light-emitting display device may be modularized with a first circuit board BD1, a second circuit board BD2, and a display panel 110. The first circuit board BD1 may include a host system 1000, a power supply 140, and a voltage switching circuit ST disposed thereon. The second circuit board BD2 may include a timing controller 170 and a gamma circuit 135 disposed thereon. The voltage switching circuit ST may be disposed inside or outside the power supply 140. The gamma circuit 135 may perform the same or similar functions or operations as those shown and described in the first example or the second example. Thus, the descriptions thereof may be discussed with reference to the portion of the first example or the second example of the present disclosure.

The timing controller 170 may be configured to output a switch control signal STC to selectively supply a first high level voltage EVDD1 or a second high level voltage EVDD2 from the power supply 140 disposed on the first circuit board BD1. In one example, the first high level voltage EVDD1 (e.g., a saturation region drive voltage) may be higher than the second high level voltage EVDD2 (e.g., a linear region drive voltage).

The timing controller 170 may be configured to generate a first switch control signal at the same time when a first drive control signal is generated by a non-linear driver disposed therein, wherein the first drive control signal enables driving for a drive transistor in a saturation region, that is, a normal driving condition.

When the timing controller 170 has outputted the first drive control signal and first switch control signal, the voltage switching circuit ST may be configured to operate such that the first high level voltage EVDD1 from the power supply 140 is supplied to the display panel 110. In this way, the display panel 110 may operate based on an operation condition of the saturation region.

The timing controller 170 may be configured to generate a second switch control signal at the same time when a second drive control signal is generated by a linear driver disposed therein, wherein the second drive control signal enables driving for the drive transistor in a linear region, that is, a change driving condition.

Further, the timing controller 170 monitors or senses a deterioration characteristic of the drive transistor, for example, Vth continuously, and generates a power variable signal EVC to increase a level of a low level voltage EVSS gradually based on the deterioration characteristic of the drive transistor, for example, Vth. At this time, the timing controller 170 performs compensation operations to avoid an increase in a data voltage $V_{DATA}$ and gradually increase the level of the level voltage EVSS, when the deterioration characteristic of the drive transistor, for example, Vth deviates from a reference range (e.g., a reference threshold voltage) set inside the timing controller 170.

When the timing controller 170 has outputted the second drive control signal and second switch control signal, the voltage switching circuit ST may be configured to operate such that the second high level voltage EVDD2 from the power supply 140 is supplied to the display panel 110. In this way, the display panel 110 may operate based on an operation condition of the linear region. When the timing controller 170 has outputted the power variable signal EVC, the power supply 140 changes a level of the second high level voltage EVDD2 based on the compensation operations by the timing controller 170 and outputs the level.

The present disclosure may reduce power consumption by the display device via the changing method of the high level voltage based on the selective driving of the drive transistor of the sub-pixel in the saturation and linear regions. Further, the present disclosure can suppress deterioration in the display image quality caused by a change in the driving scheme by taking into account the presence or absence of an anticipated image quality deterioration occurrence in selectively driving the drive transistor of the sub-pixel in the saturation and linear regions. Further, the present disclosure can delay deterioration in the drive transistor by selectively driving the drive transistor of the sub-pixel in the saturation and linear regions. Further, when driving the driving transistor in the linear region, there is an effect that the life time of the product may be improved by gradually changing the high level voltage depending on the change of the threshold voltage. Furthermore, when driving the drive transistor in the linear region, there is an effect that the power consumption may be reduced by gradually changing the low level voltage depending on the change of the threshold voltage.

It will be apparent to those skilled in the art that various modifications and variations can be made in the organic light-emitting display device and a method of driving the same of the present disclosure without departing from the spirit or scope of the disclosure. Thus, it is intended that the present disclosure cover the modifications and variations of this disclosure provided they come within the scope of the appended claims and their equivalents.

What is claimed is:

1. An organic light-emitting display device comprising:
a display panel including sub-pixels;
a power supply configured to output a voltage for driving the sub-pixels;
a selective driver configured to generate a control signal to selectively drive a drive transistor of the sub-pixels between first and second driving schemes,
wherein the drive transistor is driven in a saturation region in the first driving scheme, and is driven in a linear region in the second driving scheme;
a gamma change driver configured to change a gamma based on the driving scheme selected by the selective driver,
wherein the power supply is configured to:
supply a first level voltage to the display panel when the drive transistor of the sub-pixels is driven in the saturation region; and
supply a second level voltage to the display panel when the drive transistor of the sub-pixels is driven in the linear region, wherein the second level voltage is different from the first level voltage; and
a timing controller configured to:
monitor a threshold voltage of the drive transistor to detect deterioration;
generate a power variable signal to increase a level of the second level voltage gradually when the threshold voltage of the drive transistor deviates from a reference range stored in the timing controller; and
output the power variable signal to the power supply,
wherein the power supply is further configured to change the level of the second level voltage in response to the power variable signal from the timing controller.

2. The device of claim 1, wherein the selective driver is configured to:

generate a first control signal for driving the drive transistor in the saturation region when low and middle gray-scale ranges are expressed on the display panel; and generate a second control signal for driving the drive transistor in the linear region when a high gray-scale range is expressed on the display panel.

3. The device of claim 1, wherein the selective driver is configured to change operating condition of the drive transistor from the linear region to the saturation region based on an analysis result of image data to be supplied to the display panel.

4. The device of claim 1, wherein the selective driver is configured to change operating condition of the drive transistor from the linear region to the saturation region when image data to be supplied to the display panel has a parameter value smaller than a predetermined threshold value.

5. The device of claim 1, wherein the selective driver includes:

a normal driver configured to generate a control signal for driving the drive transistor of the sub-pixels in the saturation region;

a linear driver configured to generate a control signal for driving the drive transistor of the sub-pixels in the linear region; and a compensation module configured to compensate for variation of the display panel resulting from the selective driving between the first and second driving schemes.

6. The device of claim 1, wherein the power supply includes a voltage switching circuit configured to perform a switching operation to supply one of the first level voltage and the second level voltage to the display panel.

7. The device of claim 1, wherein the first level voltage is higher than a data voltage to be supplied to the display panel, and the second level voltage is lower than the data voltage.

8. The device of claim 1, wherein the power supply is configured to:

change a high level voltage while a low level voltage is fixed; or change the low level voltage while the high level voltage is fixed.

9. The device of claim 8, further comprising:

a compensation circuit configured to analyze a data signal to be supplied to the display panel, and to compensate the data signal to compensate and improve variation of the display panel resulting from the selective driving between the first and the second driving schemes.

10. The device of claim 9, further comprising:

the timing controller configured to output the data signal to be supplied to the display panel, and a data driver configured to convert the data signal output from the timing controller into a data voltage and to output the data voltage, wherein the timing controller includes the selective driver and the compensation circuit, and wherein the power supply is configured to change a level of the low level voltage based on a compensation operation of the data signal by the timing controller.

11. The device of claim 9, further comprising:

a first circuit board on which the power supply is disposed, a second circuit board on which the timing controller is disposed, a voltage switching circuit which is disposed on the first circuit board or the second circuit board and configured to perform a switching operation so that one of the high level voltage and the low level voltage output from the power supply is supplied to the display panel based on a control signal output from the timing controller.

12. The device of claim 11, wherein the voltage switching circuit is configured to:

perform the switching operation so that the high level voltage is supplied to the display panel when a first signal is output from the timing controller; and perform the switching operation so that the low level voltage is supplied to the display panel when a second signal is output from the timing controller.

13. A method of driving an organic light-emitting display device, the method comprising:

generating a control signal to selectively drive a drive transistor of sub-pixels between first and second driving schemes, wherein the drive transistor is driven in a saturation region in the first driving scheme, and is driven in a linear region in the second driving scheme;

generating a signal to change a gamma based on the selected driving scheme;

changing a level of a voltage to be supplied to the sub-pixels based on the selected driving scheme, wherein the changing the level of the voltage includes:

selecting a first level voltage in the first driving scheme; and selecting a second level voltage in the second driving scheme, wherein the second level voltage is different from the first level voltage, wherein the changing the level of the voltage further includes:

monitoring a threshold voltage of the drive transistor to detect deterioration;

generating a power variable signal to increase a level of the voltage gradually when the threshold voltage of the drive transistor deviates from a stored reference range; and changing the level of the voltage in response to the power variable signal.

14. The method of claim 13, wherein the changing of the level of the voltage includes changing a high level voltage while a low level voltage is fixed, or changing the low level voltage while the high level voltage is fixed.

* * * * *